(12) United States Patent
Ma et al.

(10) Patent No.: US 9,515,057 B2
(45) Date of Patent: Dec. 6, 2016

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Keum-hee Ma, Suwon-si (KR); Tae-je Cho, Hwaseong-si (KR); Ji-hwang Kim, Cheonan-si (KR)

(73) Assignee: SAMSUNG ELECTRONICS CO., LTD., Yeongton-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/541,121

(22) Filed: Nov. 13, 2014

(65) Prior Publication Data
US 2015/0130030 A1     May 14, 2015

(30) Foreign Application Priority Data

Nov. 14, 2013 (KR) .......................... 10-2013-0138363

(51) Int. Cl.
| | |
|---|---|
| H01L 25/10 | (2006.01) |
| H01L 23/31 | (2006.01) |
| H01L 21/56 | (2006.01) |
| H01L 23/00 | (2006.01) |

(52) U.S. Cl.
CPC ......... *H01L 25/105* (2013.01); *H01L 23/3128* (2013.01); *H01L 21/565* (2013.01); *H01L 23/562* (2013.01); *H01L 2224/16225* (2013.01); *H01L 2225/107* (2013.01); *H01L 2225/1023* (2013.01); *H01L 2225/1058* (2013.01)

(58) Field of Classification Search
CPC .. H01L 25/105; H01L 23/3107; H01L 23/481; H01L 2225/1023; H01L 2225/1058; H01L 2225/107; H01L 2225/3128; H01L 2224/16225; H01L 23/562; H01L 21/565
USPC ....... 257/621, 686, 685, 700, 723, 774, 777; 438/107, 109, 110, 118
See application file for complete search history.

(56) References Cited

U.S. PATENT DOCUMENTS

| | | |
|---|---|---|
| 6,337,226 B1 | 1/2002 | Symons |
| 6,353,263 B1 * | 3/2002 | Dotta .................... H01L 21/561 257/685 |

(Continued)

FOREIGN PATENT DOCUMENTS

| | | |
|---|---|---|
| JP | 2002-184936 | 6/2002 |
| JP | 2005-191229 | 7/2005 |

(Continued)

*Primary Examiner* — Thinh T Nguyen
(74) *Attorney, Agent, or Firm* — Muir Patent Law, PLLC

(57) ABSTRACT

A semiconductor package includes: a package base substrate; at least one first semiconductor chip disposed on the package base substrate; a first molding member disposed at a same level as the at least one first semiconductor chip and that does not cover an upper surface of the at least one first semiconductor chip; at least one second semiconductor chip stacked on the at least one first semiconductor chip so as to extend over the at least one first semiconductor chip and the first molding member, wherein the at least one first semiconductor chip and at least part of the first molding member are disposed between the package base substrate and the at least one second semiconductor chip; and a second molding member disposed at a same level as the at least one second semiconductor chip.

18 Claims, 30 Drawing Sheets

(56) References Cited

U.S. PATENT DOCUMENTS

| | | | |
|---|---|---|---|
| 6,621,172 B2* | 9/2003 | Nakayama | H01L 21/563 257/686 |
| 7,982,298 B1* | 7/2011 | Kang | H01L 25/03 257/621 |
| 8,110,909 B1 | 2/2012 | Hiner et al. | |
| 8,110,910 B2 | 2/2012 | Kim | |
| 8,258,007 B2 | 9/2012 | Shen et al. | |
| 8,313,982 B2 | 11/2012 | Dunne et al. | |
| 8,362,624 B2 | 1/2013 | Kang et al. | |
| 8,786,102 B2* | 7/2014 | Yoshida | H01L 24/81 257/621 |
| 9,258,922 B2* | 2/2016 | Chen | H05K 7/1061 |
| 2008/0224322 A1* | 9/2008 | Shinogi | H01L 22/10 257/777 |
| 2011/0062592 A1 | 3/2011 | Lee et al. | |
| 2011/0147911 A1* | 6/2011 | Kohl | H01L 21/6835 257/686 |
| 2012/0070939 A1* | 3/2012 | Dunne | H01L 21/563 438/110 |
| 2013/0037802 A1* | 2/2013 | England | H01L 21/568 257/48 |
| 2013/0105972 A1 | 5/2013 | Tam et al. | |
| 2013/0127050 A1 | 5/2013 | Miyagawa et al. | |

FOREIGN PATENT DOCUMENTS

| | | |
|---|---|---|
| KR | 10-1099578 | 12/2011 |
| KR | 10-2013-0052179 | 5/2013 |

* cited by examiner

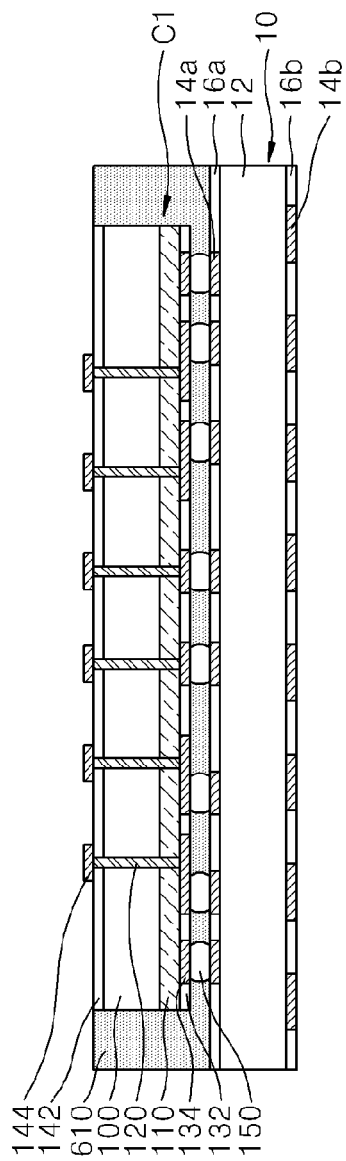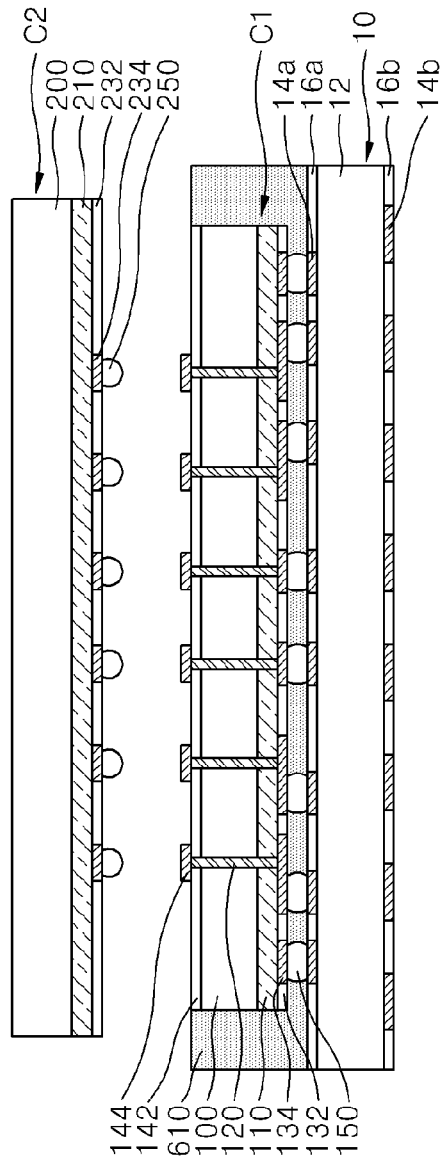

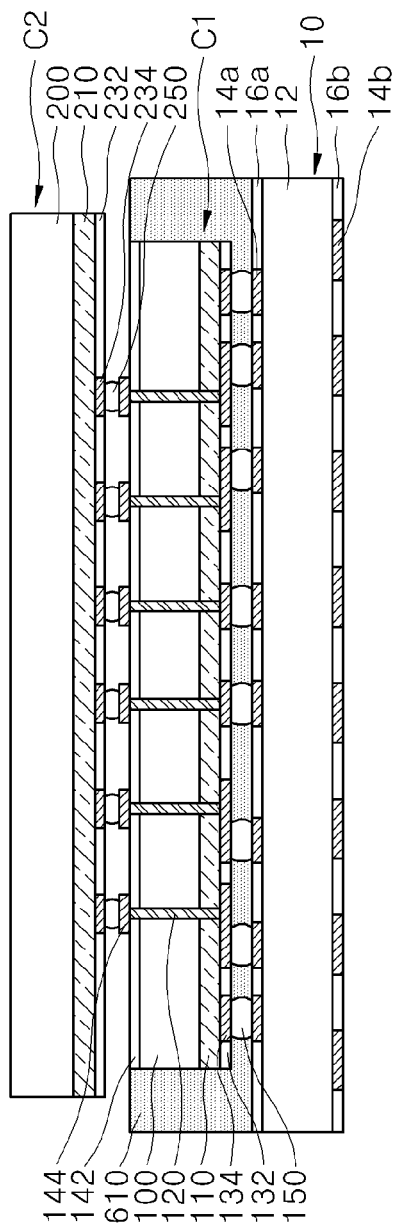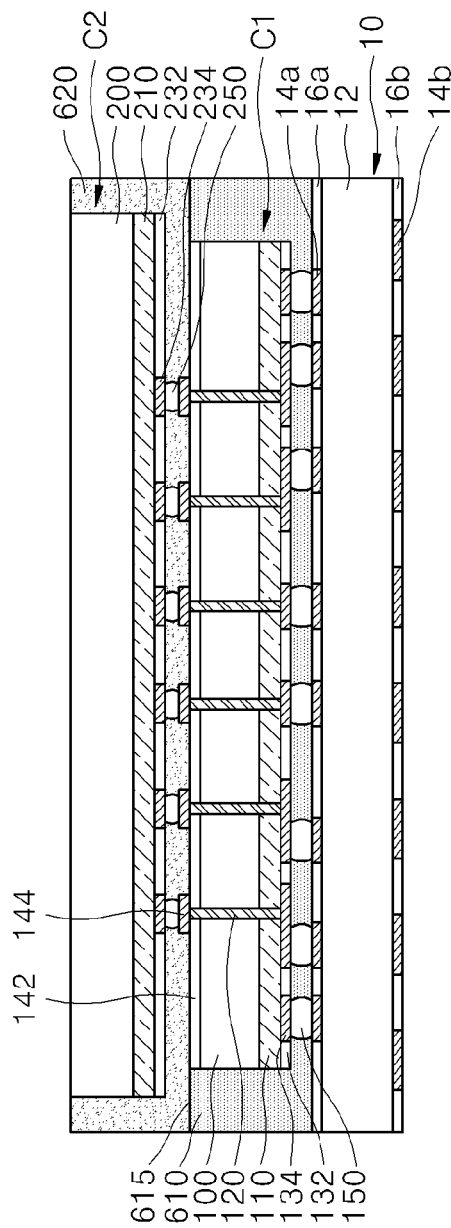

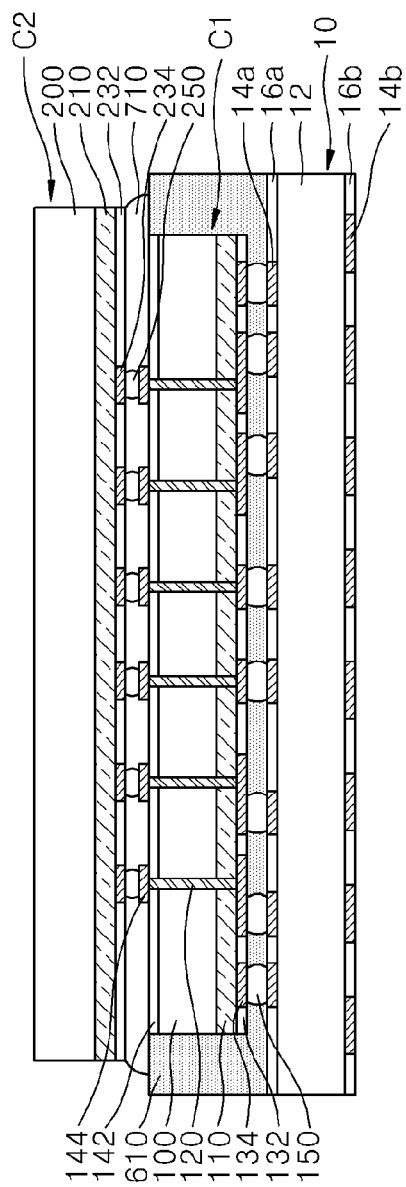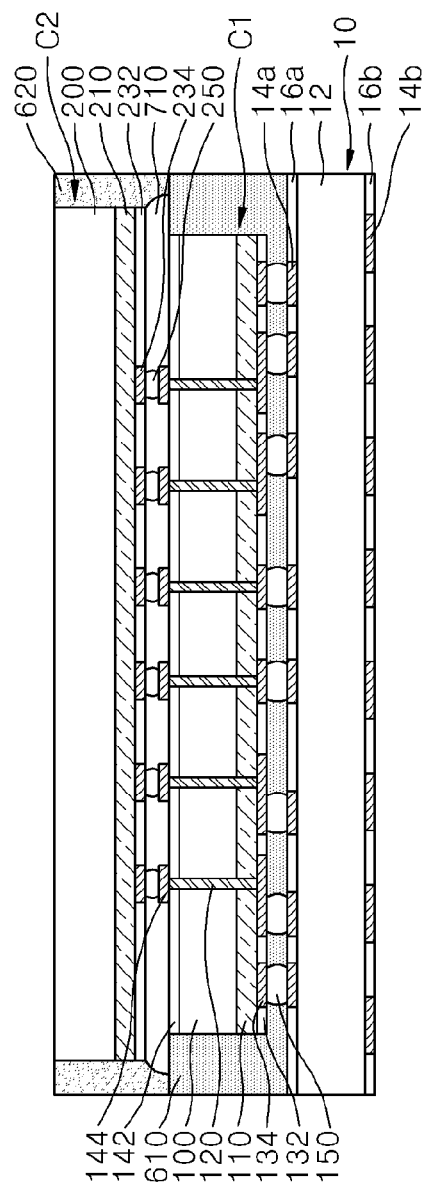

SEMICONDUCTOR PACKAGE AND METHOD OF MANUFACTURING THE SEMICONDUCTOR PACKAGE

CROSS-REFERENCE TO RELATED APPLICATIONS

This application claims the benefit of priority to Korean Patent Application No. 10-2013-0138363, filed on Nov. 14, 2013, in the Korean Intellectual Property Office, the disclosure of which is incorporated herein in its entirety by reference.

BACKGROUND

The present disclosure relates to semiconductor packages and a method of fabricating the semiconductor packages, and more particularly, to a stacked semiconductor package including a plurality of semiconductor chips, and a method of fabricating the stacked semiconductor package.

With rapid developments in the electronic industry and demands of users, electronic devices are becoming more compact, light, and multi-functional.

Accordingly, semiconductor packages for use in electronic devices are often required to be compact, light, and multi-functional, and thus stacked semiconductor packages in which a plurality of semiconductor chips are included in a single semiconductor package are in demand.

However, in the case of stacked semiconductor packages each including different types of semiconductor chips, since the order in which semiconductor chips are stacked is restricted according to the sizes of the semiconductor chips, it is difficult to obtain stacked semiconductor packages in which different semiconductor chips are stacked in consideration of their respective functions.

SUMMARY

The disclosed embodiments describe a semiconductor package in which semiconductor chips may be stacked so that one overhangs another. In some embodiments, semiconductor chips may therefore be freely stacked regardless of semiconductor chip sizes.

According to an aspect of the inventive concept, a semiconductor package includes: a package base substrate; at least one first semiconductor chip disposed on the package base substrate; a first molding member disposed at a same level as the at least one first semiconductor chip and that does not cover an upper surface of the at least one first semiconductor chip; at least one second semiconductor chip stacked on the at least one first semiconductor chip so as to extend over the at least one first semiconductor chip and the first molding member, wherein the at least one first semiconductor chip and at least part of the first molding member are disposed between the package base substrate and the at least one second semiconductor chip; and a second molding member disposed at a same level as the at least one second semiconductor chip. The second molding member may contact the first molding member at an interface, the first molding member may be formed of a material that has a first Young's modulus, and the second molding member may be formed of a material that has a second Young's modulus greater than the first Young's modulus.

The first molding member may cover a lateral surface of the at least one first semiconductor chip.

An upper surface of the first molding member may be formed at a same level as the upper surface of the at least one first semiconductor chip with respect to an upper surface of the package base substrate.

In one embodiment, the second molding member does not cover an upper surface of the at least one second semiconductor chip.

The semiconductor package may further comprise a heat dissipation member that covers the upper surface of the at least one second semiconductor chip.

The second molding member may cover a lateral surface of the at least one second semiconductor chip.

An upper surface of the second molding member may be formed on a same level as an upper surface of the at least one second semiconductor chip with respect to an upper surface of the package base substrate.

The second molding member may cover an upper surface and a lateral surface of the at least one second semiconductor chip.

In one embodiment, the material that forms the first molding member is a first material that includes first filler particles that cause the first molding member to have the first Young's modulus; and the material that forms the second molding member is the first material that includes second filler particles that cause the second molding member to have the second Young's 5 modulus. The first material may be, for example, a resin.

In one embodiment, the material that forms the second molding member covers lateral surfaces of the at least one second semiconductor chip and fills a space between the at least one first semiconductor chip and the at least one second semiconductor chip.

In one embodiment, the material that forms the second molding member covers lateral surfaces of the at least one second semiconductor chip and a different material fills a space between the at least one first semiconductor chip and the at least one second semiconductor chip, such that both the at least one second semiconductor chip and the different material cover a top-most surface of the first molding member.

The at least one first semiconductor chip may comprise a penetrating electrode, and the at least one second semiconductor chip may be electrically connected to the package base substrate via the penetrating electrode.

An upper surface of the at least one second semiconductor chip may be larger than the upper surface of the at least one first semiconductor chip.

A width of the at least one second semiconductor chip in a first direction parallel to an upper surface of the package base substrate may be greater than a width of the at least one first semiconductor chip in the first direction.

Furthermore, an outer lateral surface of the first molding member may be coplanar with an outer lateral surface of the second molding member.

According to another aspect of the inventive concept, a semiconductor package includes: a package substrate at a bottom of the semiconductor package; a first semiconductor chip stacked on the package substrate, and disposed above the package substrate; a second semiconductor chip stacked on the package substrate, and disposed above the first semiconductor chip, wherein the second semiconductor chip overhangs the first semiconductor chip; a set of first through electrodes that extend vertically through the first semiconductor chip and electrically connect circuitry of the package substrate to circuitry of the second semiconductor chip; a first molding member at a same level as the first semiconductor chip and covering lateral surfaces of the first semiconductor chip; and a second molding member at a same level as the second semiconductor chip and covering lateral surfaces of the second semiconductor chip. The second semiconductor chip vertically overlaps at least part of the first molding member.

In one embodiment, a top-most surface of the first molding member contacts a bottom-most surface of the second molding member at an interface between the first molding member and the second molding member.

In one embodiment, the first molding member has a first elasticity, and the second molding member has a second elasticity less than the first elasticity.

In certain embodiments, the first molding member and second molding member are formed either of the same materials having different amounts or sizes of filler, or of different materials.

The second molding member may fill a space between the first semiconductor chip and the second semiconductor chip.

According to another aspect of the inventive concept, a semiconductor package includes: a package substrate; a first semiconductor chip attached onto the package substrate and comprising a penetrating electrode; a first molding member that covers an upper surface of the package substrate and has an upper surface that is formed on a same plane as an upper surface of the first semiconductor chip; a second semiconductor chip that is stacked on the first semiconductor chip, is electrically connected to the package substrate via the penetrating electrode, and overlaps a portion of the first molding member as viewed from above the upper surface of the package base substrate; and a second molding member that covers at least a portion of the second semiconductor chip and has a lateral surface that extends from a lateral surface of the first molding member in a direction perpendicular to the upper surface of the package substrate.

The second molding member may have an upper surface that is formed on a same plane as an upper surface of the second semiconductor chip.

Outer lateral surfaces of the second molding member may be coplanar with outer lateral surfaces of the first molding member.

According to another aspect of the inventive concept, a method of manufacturing a semiconductor package includes: attaching a first semiconductor chip comprising a penetrating electrode onto a package base substrate; forming a first molding member that covers a lateral surface of the first semiconductor chip and does not cover an upper surface of the first semiconductor chip; stacking a second semiconductor chip on the first semiconductor chip; and forming a second molding member that covers the second semiconductor chip, wherein the stacking of the second semiconductor chip on the first semiconductor chip comprises stacking the second semiconductor chip on the first semiconductor chip such that the second semiconductor chip is electrically connected to the penetrating electrode and at least a portion of the second semiconductor chip is disposed on the first molding member.

The forming of the first molding member may comprise: attaching a mold having a flat bottom surface to the upper surface of the first semiconductor chip; introducing a molding material into a space between the mold and package base substrate to cover an upper surface of the package base substrate and the lateral surface of the first semiconductor chip; and removing the mold.

The stacking of the second semiconductor chip may comprise: attaching, to the second semiconductor chip, a non-conductive film that covers a bottom surface of the second semiconductor chip; and attaching the second semiconductor chip onto the first semiconductor chip such that the second semiconductor chip is electrically connected to the penetrating electrode.

The method of manufacturing a semiconductor package may further comprise, after the stacking of the second semiconductor chip, forming an underfill layer between the first semiconductor chip and the second semiconductor chip by using a capillary underfill method.

The forming of the second molding member may comprise forming the second molding member such that the second molding member fills a space between the first semiconductor chip and the second semiconductor chip.

The forming of the second molding member may comprise forming the second molding member such that the second molding member covers a lateral surface of the second semiconductor chip and does not cover an upper surface of the second semiconductor chip, and the method further comprises, after the forming of the second molding member, attaching a heat dissipation member that covers the upper surface of the second semiconductor chip.

BRIEF DESCRIPTION OF THE DRAWINGS

Exemplary embodiments will be more clearly understood from the following detailed description taken in conjunction with the accompanying drawings in which:

FIGS. 1 through 9 are cross-sectional views for explaining a method of manufacturing a semiconductor package according to one exemplary embodiment, and a cross-sectional view of the manufactured semiconductor package;

FIGS. 14 through 16 are cross-sectional views for explaining a method of manufacturing a semiconductor package according to another exemplary embodiment and a cross-sectional view of the manufactured semiconductor package;

DETAILED DESCRIPTION

Figure 1:
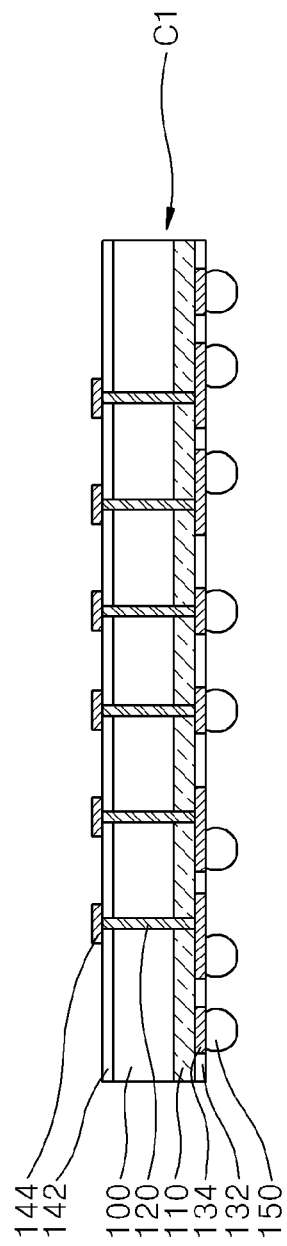

The disclosure will now be described more fully with reference to the accompanying drawings, in which exemplary embodiments are shown. The inventive concept may, however, be embodied in many different forms and should not be construed as being limited to the embodiments set forth herein. In the drawings, lengths and sizes of components may be exaggerated for convenience of explanation, and a ratio between the sizes of components may be enlarged or reduced.

It will be understood that when a component is referred to as being "on" another component or as "connected to" another component, the component can be directly on or directly connected to another component or intervening components may be present. In contrast, when a component is referred to as being "directly on" another component or "directly connected to" another element, there are no intervening components present. Other expressions describing relationships between components, such as, "between" and "directly between", will also be similarly understood. However, the term "contacting," as used herein refers to direct contact (i.e. touching) unless the context indicates otherwise.

While such terms as "first," "second," etc., may be used to describe various components, such components are not be limited to the above terms. Unless the context indicates otherwise, these terms are used only to distinguish one component from another (e.g., as a naming convention). For example, a first component discussed below could be termed a second component, and similarly, a second component may be termed a first component, without departing from the teachings of this disclosure.

An expression used in the singular form encompasses the expression in the plural form, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may added.

Unless otherwise defined, all terms used herein have the same meaning as commonly understood by one of ordinary skill in the art to which this invention belongs.

Unless particularly indicated to the contrary, the term "bottom surface of a semiconductor chip" used herein denotes one surface of the semiconductor chip that faces a package base substrate, and the term "upper surface of the semiconductor chip" denotes a surface of the semiconductor chip that is opposite to the package base substrate.

Unless particularly indicated to the contrary, the term "front surface of a semiconductor chip" used herein denotes an active surface of the semiconductor chip on which a semiconductor device is formed, and a component including the term "front surface" from among the components of a semiconductor chip is a component formed on an active surface, namely, front surface, of a semiconductor chip. The term "rear surface of a semiconductor chip" denotes a surface of the semiconductor chip opposite to the active surface of the semiconductor chip, and a component including the term "rear surface" from among the components of a semiconductor chip is a component formed on the rear surface of the semiconductor chip.

Unless particularly indicated to the contrary, the term "upper surface of a package base substrate" used herein denotes one surface of a package base substrate on which a semiconductor chip is stacked, and the term "bottom surface of the package base substrate" denotes a surface of the package base substrate opposite to the upper surface of the package base substrate, for example, a surface to which external connection ports are attached.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The disclosure will now be described more fully with reference to the accompanying drawings, in which exemplary embodiments of the inventive concept are shown. As used herein, the term "and/or" includes any and all combinations of one or more of the associated listed items. Expressions such as "at least one of," when preceding a list of elements, modify the entire list of elements and do not modify the individual elements of the list.

FIGS. 1 through 9 are cross-sectional views for explaining an exemplary method of manufacturing a semiconductor package 1 according to one embodiment, and a cross-sectional view of the manufactured semiconductor package 1.

FIG. 1 is an exemplary cross-sectional view of a first semiconductor chip C1 included in the semiconductor package 1.

Referring to FIG. 1, in the first semiconductor chip C1, a first semiconductor device 110 is formed on a first semiconductor substrate 100. The first semiconductor chip C1 may have an active surface on which the first semiconductor device 110 is formed, for example, a front surface, and a non-active surface opposite to the active surface, for example, a rear surface.

The first semiconductor substrate 100 may include, for example, silicon (Si). Alternatively, the first semiconductor substrate 100 may include a semiconductor element, such as, germanium (Ge), or a compound semiconductor, such as, Si carbide (SiC), gallium arsenide (GaAs), indium arsenide (InAs), and indium phosphide (InP). The first semiconductor substrate 100 may have a silicon-on-insulator (SOI) structure. For example, the first semiconductor substrate 100 may include a buried oxide (BOX) layer. The first semiconductor substrate 100 may include a conductive region, for example, an impurity-doped well or an impurity-doped structure. The first semiconductor substrate 100 may have various isolation structures, such as, a shallow trench isolation (STI) structure. The first semiconductor substrate 100 may be referred to herein as a chip substrate, as it forms a substrate portion of a chip. This is different from a package substrate, also described as a package base substrate, as discussed further below.

The first semiconductor device 110 may include various types of individual devices. The individual devices may include various microelectronic devices, for example, a metal-oxide-semiconductor field effect transistor (MOSFET) (e.g., a complementary metal-oxide-semiconductor (CMOS) transistor), a system large scale integration (LSI) device, an image sensor (e.g., a CMOS imaging sensor (CIS)), a micro-electro-mechanical system (MEMS) component, an active device, and a passive device. The individual devices may be electrically connected to the conductive region of the first semiconductor substrate 100. The first semiconductor device 110 may further include a conductive wiring or a conductive plug that electrically connects at least two of the individual devices to each other or electrically connects the individual devices to the conductive region of the first semiconductor substrate 100. The individual devices may be electrically separated from their adjacent individual devices by insulation layers, respectively. For example, the first semiconductor device 110 may form an integrated circuit.

The first semiconductor device 110 may include wiring structures for connecting the individual devices to first front pads 134. Pads, as described herein, may include a conductive layer positioned to pass signals from circuitry and/or conductive terminals connected at one part of the pad to circuitry and/or conductive terminals connected at another part of the pad. For example, a pad may be formed as a layer of metal at one surface of a substrate or chip, positioned to connect internal circuitry of that substrate or chip to a device or element external to the substrate or chip. Each of the wiring structures may include a metal wiring layer and a via plug. The metal wiring layer and the via plug may be formed, for example, of a wiring barrier layer and a wiring metal layer. The wiring barrier layer may include at least one material selected, for example, from among Ti, TiN, Ta, and TaN. The wiring metal layer may include at least one material selected, for example, from among tungsten (W), aluminum (Al), and copper (Cu). In certain embodiments, the metal wiring layer and the via plug may be formed of the same material. Alternatively, at least portions of the metal wiring layer and the via plug may be formed to include different materials. A plurality of the metal wiring layers and/or a plurality of the via plugs may form a multi-layered structure. For example, each of the wiring structures may be a multi-layered structure obtained by alternately stacking at least two metal wiring layers and at least two via plugs. A first front protection layer 132 for protecting the first semiconductor device 110 from external impacts or moisture may be formed on the first semiconductor device 110 of the first semiconductor chip C1.

First penetrating electrodes 120 may penetrate through the first semiconductor substrate 100. For example, each of the first penetrating electrodes 120 may be in the shape of a pillar that penetrates through the first semiconductor substrate 100. The first penetrating electrodes 120 may include a barrier layer (not shown) formed on a surface of a pillar structure, and a buried conductive layer with which the barrier layer is filled. The barrier layer may include at least one material selected, for example, from among Ti, TiN, Ta, TaN, Ru, Co, Mn, WN, Ni, and NiB, and the buried conductive layer may include at least one material selected, for example, from among Cu, a Cu alloy (e.g., CuSn, CuMg, CuNi, CuZn, CuPd, CuAu, CuRe, or CuW), W, a W alloy, Ni, Ru, and Co. A first insulation layer (not shown) may be interposed between the first semiconductor substrate 100 and each of the first penetrating electrodes 120. The first insulation layer may be formed, for example, of an oxide layer, a nitride layer, a carbide layer, or a combination thereof. In one embodiment, the first insulation layer may be formed to have a thickness of about 1500 Å to about 2500 Å. In certain embodiments, the first insulation layer surrounds lateral surfaces of each electrode of the first penetrating electrodes 120.

The first penetrating electrodes 120 shown in FIGS. 1-9 are depicted as extending through the entire semiconductor substrate 100, for example from a top surface to a bottom surface of the semiconductor substrate 100. A penetrating electrode extending as a single linear structure through an entire semiconductor substrate (e.g. through an entire chip substrate) and/or through an entire semiconductor chip in this manner is referred to as a "through electrode." For example, in one embodiment, through electrodes extend vertically through the first semiconductor chip C1 and electrically connect circuitry of the package base substrate 10 to circuitry of the second semiconductor chip C2.

In certain embodiments, however, the first penetrating electrodes 120 may each include a linear portion penetrating partly through the first semiconductor substrate 100 in a vertical direction, together with some of the metal wiring layers and the via plugs. Thus, the first penetrating electrodes 120 may be pillar structures formed of a conductive material and which penetrate through the entire first semiconductor substrate 100, such as a through electrode, or may include both a pillar structure formed of the conductive material and penetrating through part of the first semiconductor substrate 100 (e.g., from one surface of the semiconductor substrate 100 toward an inside of the semiconductor substrate 100), and some of the metal wiring layers and the via plugs (e.g., connecting to one end of the pillar structure within the semiconductor substrate 100 and extending to a second surface of the semiconductor substrate 100 opposite the first surface). The first penetrating electrodes 120 may be electrically connected to or insulated from the first semiconductor device 110 within the first semiconductor chip C1. For example, a plurality of first penetrating electrodes 120 may be formed within the first semiconductor chip C1. Within the first semiconductor chip C1, some of the first penetrating electrodes 120 may be electrically insulated from the first semiconductor device 110 and the remaining ones of the first penetrating electrodes 120 may be electrically connected to the first semiconductor device 110. Alternatively, within the first semiconductor chip C1, all of the first penetrating electrodes 120 may be electrically insulated from the first semiconductor device 110, or all of the first penetrating electrodes 120 may be electrically connected to the first semiconductor device 110.

The first front pads 134 may be formed on the active surface of the first semiconductor chip C1 and may be exposed via the first front protection layer 132. The first front pads 134 may be electrically connected to the wiring structures, and may be electrically connected to the first semiconductor device 110 via the wiring structures. Alternatively, the first front pads 134 may be portions of the wiring structures that are exposed via the first front protection layer 132. The first front pads 134 and first protection layer 132 may be considered to be part of the first semiconductor chip C1.

The first front pads 134 may be electrically connected to the first penetrating electrodes 120. A plurality of first front pads 134 may be formed, some of which may not be electrically connected to the first penetrating electrodes 120 and may instead be electrically connected to the wiring structures electrically connected to the first semiconductor device 110 and not connected to a first penetrating electrode 120. First connection bumps 150 may be formed on the first front pads 134.

First rear pads 144 may be formed on a non-active surface, for example, a rear surface, of the first semiconductor substrate 100, and may be electrically connected to the first penetrating electrodes 120. A first rear protection layer 142 may be formed on the non-active surface of the first semiconductor substrate 100 and thus may cover the non-active surface of the first semiconductor substrate 100.

In one embodiment, the first protection layer 142 exposes the first penetrating electrodes 120. The first rear pads 144 may be formed on the first penetrating electrodes 120, which are exposed via the first semiconductor substrate 142. In one embodiment, the first rear pads 144 may be omitted, and portions of the first penetrating electrodes 120 may protrude over the first rear protection layer 142.

Figure 2:
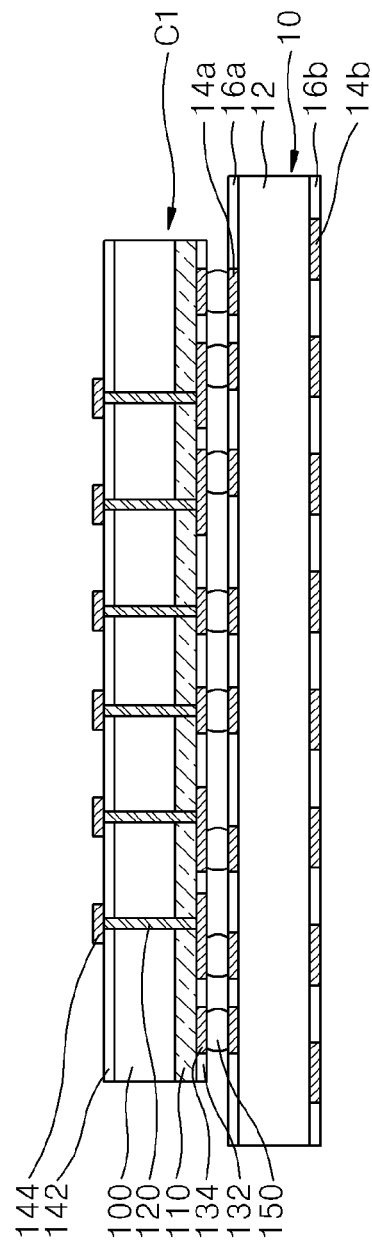

FIG. 2 is a cross-sectional view for explaining an exemplary operation of attaching the first semiconductor chip C1 to a package base substrate 10 (also referred to herein as a package substrate).

Referring to FIG. 2, the first semiconductor chip C1 is attached onto the package base substrate 10. The first semiconductor chip C1 may be attached to an upper surface of the package base substrate 10 and thus may be electrically connected to the package base substrate 10. The first semiconductor chip C1 may be attached to the upper surface of the package base substrate 10 such that the active surface of the first semiconductor chip C1 may face the package base substrate 10.

The first semiconductor chip C1 may be attached onto the package base substrate 10 such that the active surface, for example, the front surface, of the first semiconductor chip C1, on which the first semiconductor device 110 has been formed, faces the package base substrate 10. Accordingly, the active surface or front surface of the first semiconductor chip C1 may be referred to as a bottom surface, or lower surface, of the first semiconductor chip C1, in relation to the package base substrate 10. Similarly, the non-active surface or rear surface of the first semiconductor chip C1 may be referred to as a top surface, or upper surface of the first semiconductor chip C1.

A non-conductive film (not shown) may be attached to the bottom surface of the first semiconductor chip C1. The non-conductive film may function as an underfill layer that fills a space between the package base substrate 10 and the first semiconductor chip C1. However, as will be described later, with no non-conductive films attached to the bottom surface of the first semiconductor chip C1, the first semiconductor chip C1 may be attached onto the package base substrate 10.

The package base substrate 10 may be, for example, a printed circuit board (PCB) or a lead frame. When the package base substrate 10 is a PCB, the package base substrate 10 may include a substrate base 12, and first contact ports 14a and second contact ports 14b respectively formed on an upper surface and a bottom surface of the substrate base 12. The first contact ports 14a and the second contact ports 14b may be respectively exposed via a first solder resist layer 16a and a second solder resist layer 16b, which respectively cover the upper surface and the bottom surface of the substrate base 12.

The substrate base 12 may be formed, for example, of at least one material selected from phenol resin, epoxy resin, and polyimide. For example, the substrate base 12 may include at least one material selected from among FR4, tetrafunctional epoxy, polyphenylene ether, epoxy/polyphenylene oxide, bismaleimide triazine (BT), thermount, cyanate ester, polyimide, and liquid crystal polymer. The first contact ports 14a and the second contact ports 14b may be formed of a conductive material such as a metal (e.g., copper, nickel, stainless steel, or beryllium copper). Internal contact ports (not shown) electrically connected to the first contact ports 14a and the second contact ports 14b may be formed in the substrate base 12.

In one embodiment, the first contact ports 14a and the second contact ports 14b may be portions of circuit wirings obtained by coating the upper surface and the bottom surface of the substrate base 12 with Cu foils and patterning the Cu foils, the portion of the circuit wiring obtained by coating the upper surface and the portion of the circuit wiring obtained by coating the bottom surface being respectively exposed via the first solder resist layer 16a and the second solder resist layer 16b.

In one embodiment, the first connection bumps 150 are disposed between the first contact ports 14a and the first front pads 134 and electrically connect the first contact ports 14a to the first front pads 134. The first connection bumps 150 and the first contact ports 14a may be connected to each other, for example, by thermo compression bonding or reflow bonding. The first semiconductor chip C1 may be electrically connected to the package base substrate 10 via the first connection bumps 150. The first connection bumps 150 are also referred to herein as conductive interconnection terminals, or more generally as conductive terminals.

Figure 3:
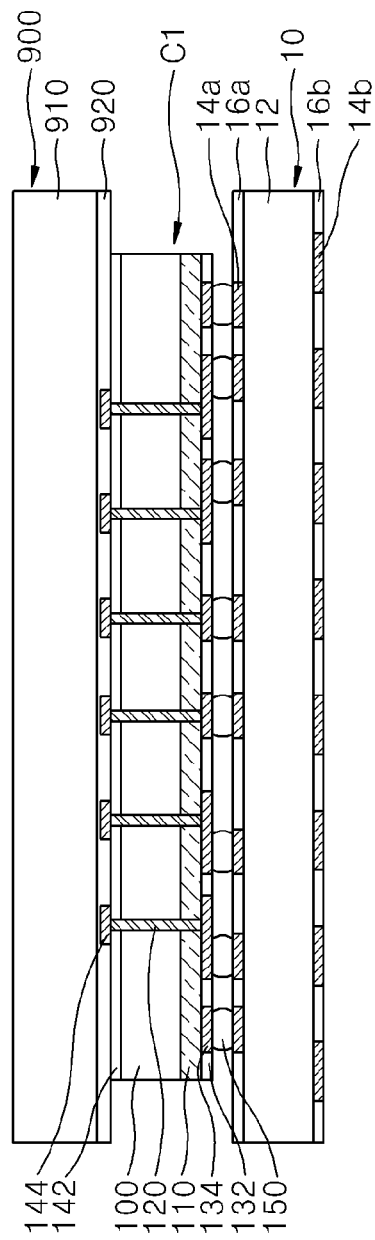

FIG. 3 is a cross-sectional view for explaining an exemplary operation of attaching a mold 900 to the upper surface of the first semiconductor chip C1.

Referring to FIG. 3, the mold 900 is attached onto the first semiconductor chip C1 attached onto the package base substrate 10. The mold 900 may have a flat bottom surface, and may be attached to the upper surface of the first semiconductor chip C1 so as to cover the entire upper surface of the first semiconductor chip C1.

The upper surface of the first semiconductor chip C1 may be flat in a macro perspective but may have steps in a micro perspective. These steps may be caused due to a process uniformity issue, the structure of the semiconductor device 110, a step difference between the first rear pads 144 and the first rear protection layer 142, or the like. Accordingly, the mold 900 may include a mold body 910 and a buffer layer 920 attached to a bottom surface of the mold body 910, in order to prevent a space from being formed between the mold 900 and the first semiconductor chip C1 due to the microscopic steps existing on the upper surface of the first semiconductor chip C1. The buffer layer 920 may allow the mold 900 and the semiconductor chip C1 to closely adhere to each other, because in one embodiment, the buffer layer 920 is relatively elastic.

Due to the mold 900, the upper surface of the first semiconductor chip C1 may not be exposed, and a space may be formed only around the bottom surface and lateral surface of the first semiconductor chip C1.

Figure 4:
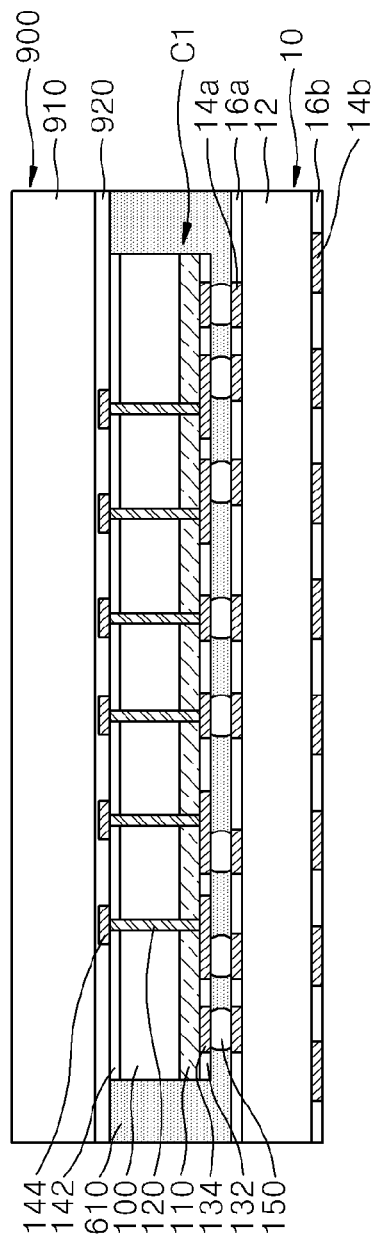

FIG. 4 is a cross-sectional view for explaining an exemplary operation of forming a first molding member 610.

Referring to FIG. 4, a first molding member 610 is formed by introducing (e.g., injecting) first molding material into a space defined by the first semiconductor chip C1 attached to the package base substrate 10 and the mold 900. The first molding member 610 may be formed, for example, by hardening the first molding material. The various individual and combined molding members described herein may be referred to herein as molding structures. After the formation of the first molding member 610, the mold 900 is removed. The first molding member 610 may cover the lateral surface of the first semiconductor chip C1. The first molding member 610 may cover the entire lateral surface of the first semiconductor chip C1.

A space between the first semiconductor chip C1 and the package base substrate 10 may be filled with an underfill layer (not shown). The underfill layer may be formed using a capillary underfill method. Alternatively, the space between the first semiconductor chip C1 and the package base substrate 10 may be filled with the first molding member 610, as illustrated in FIG. 4, by using a molded underfill (MUF) process. Thus, the first molding member 610 may be formed both to cover the lateral surfaces of the first semiconductor chip C1 and to fill in the space between the first semiconductor chip C1 and the package base substrate 10. The material or materials that fill in the space between the first semiconductor chip C1 and the package substrate 10 and fills in the space around the first semiconductor chip C1 (e.g., surrounds the first semiconductor chip C1 by covering the lateral surfaces of the first semiconductor chip C1) may be collectively referred to as a filling layer, or filling structure. As such, the filling layer may be of unitary construction, for example, including a single type of material such as shown in FIG. 4, or may be formed of one or more portions that include, for example, different types of materials, such as shown in later examples.

In certain embodiments, a method of filling the space between the first semiconductor chip C1 and the package base substrate 10 is similar to a method of filling a space between the second semiconductor chip C2 and the first semiconductor chip C1, which will be described later with reference to FIGS. 8, 14, 18, and 19, and thus a detailed description thereof will be omitted herein.

As described above with reference to FIG. 2, a non-conductive film may serve as the underfill layer between the first semiconductor chip C1 and the package base substrate 10. Alternatively, the underfill layer may be formed using a capillary underfill method, or the first molding member 610 may be filled between the first semiconductor chip C1 and the package base substrate 10 via an MUF process.

FIG. 5 is a cross-sectional view for explaining an exemplary operation of forming the first molding member 610.

Referring to FIG. 5, the first molding member 610 may be formed on the package base substrate 10 so as to cover the first semiconductor chip C1. The first molding member 610 may be formed of, for example, an epoxy mold compound (EMC). The first molding member 610 may be formed to cover the lateral surface of the first semiconductor chip C1, while exposing the upper surface, namely, the non-active surface, of the first semiconductor chip C1. The first molding member 610 may cover the entire lateral surface of the first semiconductor chip C1. Thus, the lateral surface of the first semiconductor chip C1 may be completely covered by the first molding member 610. An upper surface of the first molding member 610 may be formed on the same plane as the upper surface of the first semiconductor chip C1. Thus, the upper surface of the first molding member 610 may be formed on the same level as the upper surface of the first semiconductor chip C1 with respect to the upper surface of the package base substrate 10. The molding member 610 may also fill in the space between the first semiconductor chip C1 and the package base substrate 10.

In certain embodiments, the first molding member 610 may have a Young's modulus of less than 1 GPa, for example, several tens to several hundreds of MPa. The first molding member 610 may be formed of, for example, a silicone-based material, a thermosetting material, a thermoplastic material, a UV curable material, or the like. The thermosetting material may include, for example, a phenol type, acid anhydride type, or amine type hardener and an acrylic polymer addition agent.

The first molding member 610 may be formed of resin with an amount of filler which is relatively small with respect to that included in a resin used for forming a second molding member 620 described below. For example, the first molding member 610 may be formed of resin including filler particles which are small in size relative to that of filler particles included in the resin used for forming the second molding member 620 described below, or including the same sized filler particles, but fewer of them. In one embodiment, the filler may be a silica filler.

FIG. 6 is a cross-sectional view of a second semiconductor chip C2 on the first semiconductor chip C1.

Referring to FIG. 6, in the second semiconductor chip C2, a second semiconductor device 210 is formed on a second semiconductor substrate 200.

The second semiconductor substrate 200 may include, for example, silicon (Si). Alternatively, the second semiconductor substrate 200 may include a semiconductor material, such as, germanium (Ge), or a compound semiconductor, such as, SiC, GaAs, InAs, and InP. The second semiconductor substrate 200 may have an SOI structure. For example, the second semiconductor substrate 200 may include a BOX layer. The second semiconductor substrate 200 may include a conductive region, for example, an impurity-doped well or an impurity-doped structure. The second semiconductor substrate 200 may have various isolation structures, such as, an STI structure. The second semiconductor substrate 200 may also be referred to herein as a chip substrate.

The second semiconductor device 210 may include various types of individual devices. The individual devices may include various microelectronic devices, for example, a metal-oxide-semiconductor field effect transistor (MOSFET) (e.g., a complementary metal-oxide-semiconductor (CMOS) transistor), a system large scale integration (LSI) device, an image sensor (e.g., a CMOS imaging sensor (CIS)), a micro-electro-mechanical system (MEMS) component, an active device, and a passive device. The individual devices may be electrically connected to the conductive region of the second semiconductor substrate 200. The second semiconductor device 210 may further include a conductive wiring or conductive plug that electrically connects at least two of the individual devices to each other or electrically connects the individual devices to the conductive region of the first semiconductor substrate 200. The individual devices may be electrically separated from their adjacent individual devices by insulation layers, respectively. The second semiconductor device 210 may be, for example, an integrated circuit.

The second semiconductor device 210 may include wiring structures for connecting the individual devices to second front pads 234. Each of the wiring structures may include a metal wiring layer and a via plug. The metal wiring layer and the via plug may be formed of a wiring barrier layer and a wiring metal layer. The wiring barrier layer may include at least one material selected, for example, from among Ti, TiN, Ta, and TaN. The wiring metal layer may include at least one material selected, for example, from among W, Al, and Cu. The metal wiring layer and the via plug may be formed of the same material. Alternatively, at least portions of the metal wiring layer and the via plug may be formed to include different materials. A plurality of the metal wiring layers and/or a plurality of the via plugs may form a multi-layered structure. In certain embodiments, each of the wiring structures may be a multi-layered structure obtained by alternately stacking at least two metal wiring layers and at least two via plugs. A second front protection layer 232 for protecting the second semiconductor device 210 from external impacts or moisture may be formed on the second semiconductor device 210 of the second semiconductor chip C2.

The second front pads 234 may be formed on an active surface of the second semiconductor chip C2 and may be exposed via the second front protection layer 232. The second front pads 234 may be electrically connected to the wiring structures, and may be electrically connected to the second semiconductor device 210 via the wiring structures. Alternatively, the second front pads 234 may be portions of the wiring structures that are exposed via the second front protection layer 232. Second connection bumps 250 may be formed on the second front pads 234.

Since the active surface, namely, the front surface, of the second semiconductor chip C2 is attached onto the first semiconductor chip C1 so as to face the package base substrate 10, the active surface, namely, the front surface, of the second semiconductor chip C2 may be referred to as a bottom or lower surface of the second semiconductor chip C2. A non-active surface, namely, a rear surface, of the second semiconductor chip C2 may be referred to as a top or upper surface of the second semiconductor chip C2.

FIG. 7 is a cross-sectional view for explaining an exemplary operation of attaching the second semiconductor chip C2 onto the first semiconductor chip C1.

Referring to FIG. 7, the second semiconductor chip C2 is attached onto the first semiconductor chip C1. The second semiconductor chip C2 may be attached to the upper surface of the first semiconductor chip C1 and thus may be electrically connected to the first penetrating electrodes 120 of the first semiconductor chip C1.

The second semiconductor chip C2 may be attached onto the first semiconductor chip C1 and the first molding member 610 such that the active surface, for example, the front surface, of the second semiconductor chip C2, on which the second semiconductor device 210 has been formed, faces the first semiconductor chip C1.

The second connection bumps 250 may be disposed between the first rear pads 144 and the second front pads 234 and thus may electrically connect the first rear pads 144 to the second front pads 234. The second connection bumps 250 and the first rear pads 144 may be connected to each other, for example, by thermo compression bonding or reflow bonding. The second semiconductor chip C2 may be electrically connected to the first penetrating electrodes 120 via the second connection bumps 250. The second semiconductor chip C2 may be electrically connected to the package base substrate 10 via the first penetrating electrodes 120. A combination of bumps and pads that the bumps contact may be referred to generally herein as interconnection terminals, or conductive interconnection terminals.

An area of the upper surface of the second semiconductor chip C2 may be greater than that of the upper surface of the first semiconductor chip C1. For example, the second semiconductor chip C2 may cover the entire upper surface of the first semiconductor chip C1 and a portion of the upper surface of the first molding member 610 that is adjacent to the first semiconductor chip C1, as viewed from above the upper surface of the package base substrate 10. As such, the second semiconductor chip C2 may overhang the first semiconductor chip C1 on at least one side and may also vertically overlap part of the first molding member 610, which may be formed at the same level as the first semiconductor chip C1 (e.g., part of all of the first semiconductor chip C1 may be located at part or all of the same level as the first molding member 610). Alternatively or additionally, a width of the second semiconductor chip C2 in a first direction (for example, a horizontal direction in FIG. 7) parallel to the upper surface of the package base substrate 10 may be greater than that of the first semiconductor chip C1. For example, the second semiconductor chip C2 may cover a portion of the upper surface of the first semiconductor chip C1 and a portion of the upper surface of the first molding member 610 that is adjacent to the first semiconductor chip C1, as viewed from above the upper surface of the package base substrate 10, in a first direction.

Therefore, the second semiconductor chip C2 may be stacked on the first semiconductor chip C1 and may overlap a portion of the first molding member 610 as viewed in a direction perpendicular to the upper surface of the package base substrate 10. Accordingly, the second semiconductor chip C2 may overlap at least a portion of the first semiconductor chip C1 and a portion of the first molding member 610, as viewed from above the upper surface of the package base substrate 10. Though the width of the second semiconductor device C2 in the first direction may be greater than the width of the first semiconductor device C1 in the first direction, the length in a second direction of the two semiconductor devices C1 and C2 be the same, or the length in the second direction of first semiconductor device C1 may be greater than the length in the second direction of second semiconductor device C1.

FIG. 8 is a cross-sectional view for explaining an operation of forming a second molding member 620.

Referring to FIG. 8, the second molding member 620 may be formed so as to cover the lateral surface of the second semiconductor chip C2, while exposing the upper surface, namely, the non-active surface, of the second semiconductor chip C2. The second molding member 620 may cover the entire lateral surface of the second semiconductor chip C2. In other words, the lateral surface of the second semiconductor chip C2 may be completely covered by the second molding member 620. An upper surface of the second molding member 620 may be formed on the same plane as the upper surface of the second semiconductor chip C2. As such, the upper surface of the second molding member 620 may be formed at the same level as the upper surface of the second semiconductor chip C2 with respect to the upper surface of the package base substrate 10. Thus, the second molding member 620 may be formed at the same level as the second semiconductor chip C2 (e.g., part of all of the second semiconductor chip C2 may be located at part or all of the same level as the second molding member 620)

A lateral surface of the second molding member 620 may extend from the lateral surface of the first molding member 610 in a direction perpendicular to the upper surface of the package base substrate 10. The second molding member 620 may cover the entire upper-most surface of the first molding member 610. Thus, in one embodiment, an outer lateral surface of the first molding member 610 is coplanar with an outer lateral surface of the second molding member 620.

In one embodiment, the second molding member 620 may be formed using the same method as the method of forming the first molding member 610, which has been described above with reference to FIGS. 3-5, and thus a detailed description thereof will be omitted.

The first and second molding members 610 and 620 may be formed of the same material. Alternatively, the first and second molding members 610 and 620 may be formed of different types of materials. Also, the components of the first and second molding members 610 and 620 may have different physical characteristics.

In one embodiment, the second molding member 620 may have a Young's modulus of 1 GPa or greater, for example, several to several tens of GPa. The second molding member 620 may be formed of, for example, an epoxy-based material, a thermosetting material, a thermoplastic material, a UV curable material, or the like. The thermosetting material may include a phenol type, acid anhydride type, or amine type hardener and an acrylic polymer addition agent.

The second molding member 620 may be formed of resin with a relatively large amount of filler. For example, the second molding member 620 may be formed of an epoxy-based material including silica filler of about 80%. As described above, when the first and second molding members 610 and 620 are formed of the same resin, the Young's moduli of the first and second molding members 610 and 620 may be adjusted according to the amount of filler contained in the resin, for example, the density of the filler. Thus, the Young's modulus of the first molding member 610 may be reduced by using a resin having a relatively small amount of filler or a resin having filler particles of relatively small particle size to form the first molding member 610, and the Young's modulus of the second molding member 620 may be increased by using a resin having a relatively large amount of filler (as compared to the first molding member 610), for example a resin having filler particles of relatively large particle size, or having a greater number of similar-sized filler particles to form the second molding member 620.

The second molding member 620 may also be formed using the MUF process, and thus a material that covers the lateral surface of the second semiconductor chip C2 may be the same as a material that fills a space between the first and second semiconductor chips C1 and C2. Thus, the second molding member 620, also referred to as a filling layer, may be formed both to cover the lateral surfaces of the second semiconductor chip C2 and to fill in the space between the second semiconductor chip C2 and the first semiconductor chip C1. Part of the second molding member 620 (e.g., a bottom surface outside of the area occupied by the first semiconductor chip C1) may contact part of the first molding member 610 (e.g., a top surface outside of the area occupied by the first semiconductor chip C1). Also, as can be seen in FIG. 8, in one embodiment, a top-most surface of the first molding member 610 contacts a bottom-most surface of the second molding member 620 at an interface 615 between the first molding member and the second molding member.

Figure 9:
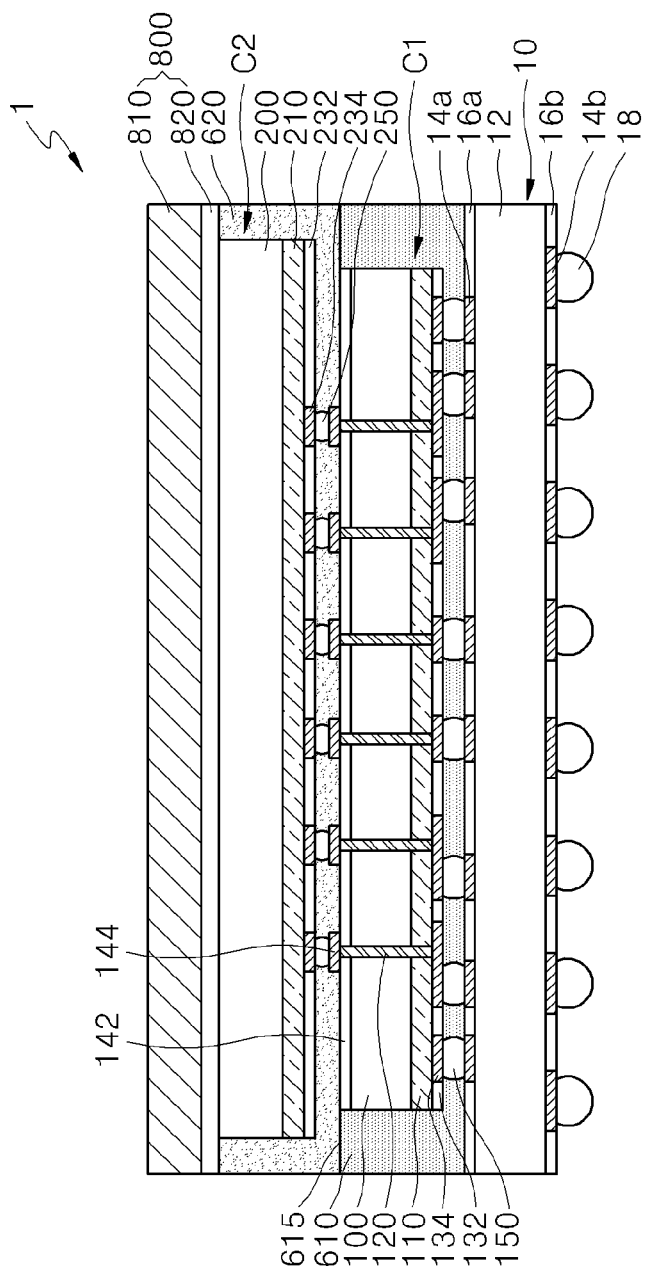

FIG. 9 is an exemplary cross-sectional view of the semiconductor package 1.

Referring to FIG. 9, the semiconductor package 1 includes the package base substrate 10, and the first semiconductor chip C1 and the second semiconductor chip C2 sequentially stacked on the upper surface of the package base substrate 10.

External connection ports 18 may be attached onto the second contact ports 14b, which are formed on the bottom surface of the package base substrate 10. The external connection ports 18 may be, for example, bumps or solder balls. Each external connection port 18 and/or its corresponding second contact port 14b may be referred to herein as an external connection terminal. The external connection ports 18 may electrically connect the semiconductor package 1 to an external device.

The first semiconductor chip C1 may be attached to the upper surface of the package base substrate 10 and thus may be electrically connected to the package base substrate 10. The first semiconductor chip C1 may be attached to the upper surface of the package base substrate 10 such that the active surface of the first semiconductor chip C1 (e.g., the front surface, on which the first semiconductor device 110 has been formed) faces the package base substrate 10.

The first connection bumps 150 may be disposed between the first contact ports 14a and the first front pads 134 and may electrically connect the first contact ports 14a to the first front pads 134. The first connection bumps 150 and the first contact ports 14a may be connected to each other, for example, by thermo compression bonding or reflow bonding. The first semiconductor chip C1 may be electrically connected to the package base substrate 10 via the first connection bumps 150. Each first contact pad 14a, respective first connection bump 150, and/or respective first front pad 134 may be referred to herein as a conductive interconnection terminal.

The first molding member 610 may be formed on the package base substrate 10 so as to cover the first semiconductor chip C1. The first molding member 610 may be formed of, for example, an EMC. The first molding member 610 may cover the lateral surface of the first semiconductor chip C1, while exposing the upper surface, namely, the non-active surface, of the first semiconductor chip C1. The first molding member 610 may cover the entire lateral surface of the first semiconductor chip C1. In other words, the lateral surface of the first semiconductor chip C1 may be completely covered by the first molding member 610. The upper surface of the first molding member 610 may be formed on the same plane as the upper surface of the first semiconductor chip C1. Therefore, the upper surface of the first molding member 610 may be formed at the same level as the upper surface of the first semiconductor chip C1 with respect to the upper surface of the package base substrate 10.

The second semiconductor chip C2 may be stacked on the first semiconductor chip C1. The second semiconductor chip C2 may be stacked on the first semiconductor chip C1 so as to extend over the first semiconductor chip C1 and the first molding member 610. The second semiconductor chip C2 may overlap a portion of the first molding member 610 as viewed from above the upper surface of the package base substrate 10.

The area of the upper surface of the second semiconductor chip C2 may be greater than that of the upper surface of the first semiconductor chip C1. For example, the second semiconductor chip C2 may cover the entire upper surface of the first semiconductor chip C1 and the portion of the upper surface of the first molding member 610 that is adjacent to the first semiconductor chip C1, as viewed from above the upper surface of the package base substrate 10. Alternatively, the width of the second semiconductor chip C2 in a first direction (for example, a horizontal direction in FIG. 9) parallel to the upper surface of the package base substrate 10 may be greater than that of the first semiconductor chip C1. For example, the second semiconductor chip C2 may cover at least a portion of the upper surface of the first semiconductor chip C1 and the portion of the upper surface of the first molding member 610 adjacent to the first semiconductor chip C1, as viewed from above the upper surface of the package base substrate 10.

In the second semiconductor chip C2, the second semiconductor device 210 is formed on the second semiconductor substrate 200. The second semiconductor chip C2 may be attached onto the first semiconductor chip C1 and the first molding member 610 such that the active surface, for example, the front surface, of the second semiconductor chip C2, on which the second semiconductor device 210 has been formed, faces the first semiconductor chip C1.

The second front pads 234 may be formed on the active surface of the second semiconductor chip C2 and may be exposed via the second front protection layer 232. The second connection bumps 250 may be formed on the second front pads 234. The second connection bumps 250 may be disposed between the first rear pads 144 and the second front pads 234 and thus may electrically connect the first rear pads 144 to the second front pads 234. The second connection bumps 250 and the first rear pads 144 may be connected to each other, for example, by thermo compression bonding or reflow bonding. Each second front pad 234, respective second connection bump 150, and/or respective first rear pad 134 may be referred to herein as a conductive interconnection terminal. The second semiconductor chip C2 may be electrically connected to the first penetrating electrodes 120 via the second connection bumps 250. Each first penetrating electrode 120 may be vertically aligned with a respective second connection bump 250. The second semiconductor chip C2 may be electrically connected to the package base substrate 10 via the first penetrating electrodes 120.

The second molding member 620 may be formed on the first molding member 610 so as to cover the second semiconductor chip C2. The second molding member 620 may be formed of, for example, an EMC. The second molding member 620 may cover the lateral surface of the second semiconductor chip C2, while exposing the upper surface, namely, the non-active surface, of the second semiconductor chip C2. The second molding member 620 may cover the entire lateral surface of the second semiconductor chip C2. In other words, the lateral surface of the second semiconductor chip C2 may be completely covered by the second molding member 620. The upper surface of the second molding member 620 may be formed on the same plane as the upper surface of the second semiconductor chip C2. Therefore, the upper surface of the second molding member 620 may be formed at the same level as the upper surface of the second semiconductor chip C2 with respect to the upper surface of the package base substrate 10.

The lateral surface of the second molding member 620 may extend from the lateral surface of the first molding member 610 in the direction perpendicular to the upper surface of the package base substrate 10. The second molding member 620 may cover the entire upper-most surface of the first molding member 610.

The first and second molding members 610 and 620 may be formed of the same material. Alternatively, the first and second molding members 610 and 620 may be formed of different types of materials. Alternatively, the components of the first and second molding members 610 and 620 may have different physical characteristics.

The first molding member 610 may have a Young's modulus of less than 1 GPa, for example, several tens to several hundreds of MPa. The first molding member 610 may be formed of, for example, a silicone-based material, a thermosetting material, a thermoplastic material, a UV curable material, or the like. The thermosetting material may include a phenol type, acid anhydride type, or amine type hardener and an acrylic polymer addition agent.

The first molding member 610 may be formed of resin with a relatively small amount of filler. Here, the terminology 'relatively small' denotes that the amount of filler included in the first molding member 610 is small compared to the amount of filler included in the second molding member 620. More precisely, the reference to a relatively small amount of filler, in one embodiment, denotes that the amount of filler per unit volume, e.g., the density of filler included in the first molding member 610, is small compared to the amount of filler per unit volume, e.g., the density of filler, included in the second molding member 620. In more detail, when the first and second molding members 610 and 620 are formed of the same resin, the Young's moduli of the first and second molding members 610 and 620 may be adjusted according to the amount of filler contained in the resin. Thus, the Young's modulus of the first molding member 610 may be reduced by using a resin having a relatively small amount of filler to form the first molding member 610, and the Young's modulus of the second molding member 620 may be increased by using a resin having a relatively large amount of filler to form the second molding member 620. For example, the first molding member 610 may include filler particles which are relatively small in size, and the second molding member 620 may include filler particles that are relatively large in size. By reference, a Young's modulus represents an elastic coefficient, and thus a material with a small Young's modulus may be more elastic and may be flexible or soft, and a material with a large Young's modulus may be less elastic and may be solid or hard. In one embodiment, the filler may be a silica filler.

The first molding member 610 may be formed, for example, using an MUF process. Accordingly, the material that covers the lateral surface of the first semiconductor chip C1 may be the same as the material that fills a space between the first semiconductor chip C1 and the package base substrate 10.

Since the first molding member 610 has a relatively small Young's modulus as described above, the first molding member 610 may be easily handled during processes subsequent to a molding process and may minimize occurrence of warpage to the semiconductor package 1.

The second molding member 620 may cover the lateral surface of the second semiconductor chip C2 and the upper-most surface of the first molding member 610 (e.g., the upper surface outside the area of the first semiconductor chip C1). The second molding member 620 may have a Young's modulus of 1 GPa or greater, for example, several to several tens of GPa. The second molding member 620 may be formed of, for example, an epoxy-based material, a thermosetting material, a thermoplastic material, a UV curable material, or the like. The thermosetting material may include a phenol type, acid anhydride type, or amine type hardener and an acrylic polymer addition agent.

The second molding member 620 may be formed of resin with a relatively large amount of filler. For example, the second molding member 620 may be formed of an epoxy-based material including silica filler of about 80%. As described above, when the first and second molding members 610 and 620 are formed of the same resin, the Young's moduli of the first and second molding members 610 and 620 may be adjusted according to the amount of filler contained in the resin, e.g., the density of the filler. Thus, the Young's modulus of the first molding member 610 may be reduced by containing a relatively small amount or size of filler in the resin used to form the first molding member 610, and the Young's modulus of the second molding member 620 may be increased by containing a relatively large amount or size of filler in the resin used to form the second molding member 620.

The second molding member 620 may also be formed using the MUF process, and thus the material that covers the lateral surface of the second semiconductor chip C2 may be the same as the material that fills a space between the first and second semiconductor chips C1 and C2.

In the semiconductor package 1 according to the certain embodiments, the first molding member 610, covering the lateral surface of the first semiconductor chip C1, and the second molding member 620, covering the lateral surface of the second semiconductor chip C2, may be formed of materials having different Young's moduli than each other, thereby addressing occurrence of warpage to the semiconductor package 1. For example, in one embodiment, the first molding member 610 is formed of a material with a small Young's modulus and the second molding member 620 is formed of a material with a large Young's modulus in a packaging process, whereby a stress applied to the first semiconductor chip C1 may be reduced and the first semiconductor chip C1 and the first molding member 610 may be maintained firmly. Accordingly, when a second semiconductor chip C2 having an upper surface with a larger area than that of the upper surface of the first semiconductor chip C1 or a second semiconductor chip C2 having a greater width in the first direction than that of the first semiconductor chip C1 is stacked on the first semiconductor chip C1, the second semiconductor chip C2 protrudes beyond the first semiconductor chip C1 to thereby prevent the second semiconductor chip C2 from being cracked.

Due to the difference between the areas of the upper surfaces of the first and second semiconductor chips C1 and C2 or the difference between the widths of the first and second semiconductor chips C1 and C2, a lower portion of the semiconductor package 1, namely, a portion of the semiconductor package 1 in which the first semiconductor chip C1 is disposed, may shrink or expand differently than an upper portion of the semiconductor package 1, namely, a portion of the semiconductor package 1 in which the second semiconductor chip C2 is disposed, and thus warpage of the semiconductor package 1 may occur. In order to address this problem, the first molding member 610 and the second molding member 620 may be formed of materials having different Young's moduli than each other. For example, controlling warpage of the semiconductor package 1 so that shrinkage or expansion degrees of the upper and lower portions of the semiconductor package 1 are similar may be achieved by forming the first molding member 610 of a material having a larger Young's modulus than that of a material used for forming the second molding member 620 or by forming the second molding member 620 of a material having a larger Young's modulus than that of a material used for forming the first molding member 610.

As illustrated in FIG. 9, the semiconductor package 1 may further include a heat dissipation member 800 which covers the upper surface of the second semiconductor chip C2. The heat dissipation member 800 may cover both the upper surface of the second semiconductor chip C2 and the upper surface of the second molding member 620. The heat dissipation member 800 may be a heat dissipation plate 810 such as a heat slug or a heat sink. The heat dissipation member 800 may further include a thermal interface material (TIM) 820 disposed between the heat dissipation plate 810 and the second semiconductor chip C2. The TIM 820 may be, for example, a paste, a film, or the like. The TIM 820 may fill a gap that may be generated between the second semiconductor chip C2 and the heat dissipation plate 810, thereby increasing the efficiency of heat transfer from the second semiconductor chip C2 to the heat dissipation plate 810.

As illustrated in FIG. 8, the semiconductor package 1 may be completed without the heat dissipation member 800. In this case, heat may be discharged via the upper surface of the second semiconductor chip C2, which is exposed via the second molding member 620.

Figure 10:
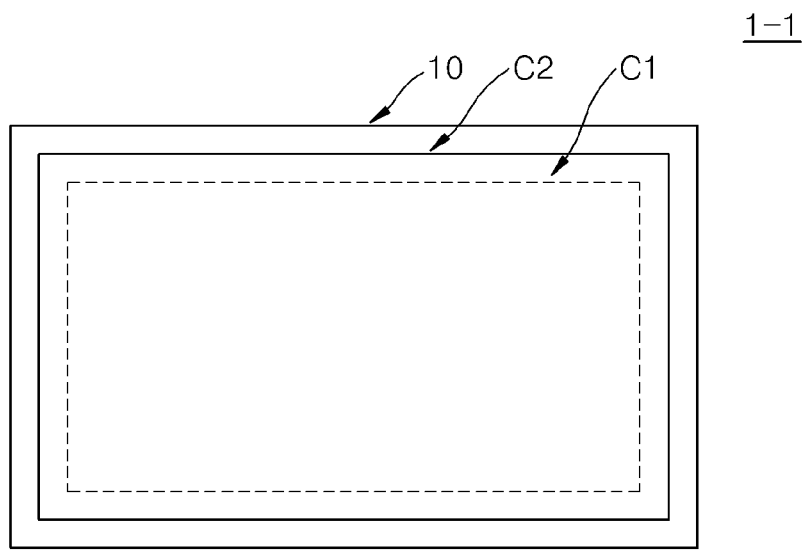
FIGS. 10 through 12 are plan views for illustrating exemplary aspects of the semiconductor package of FIGS. 1-9.
Figure 11:
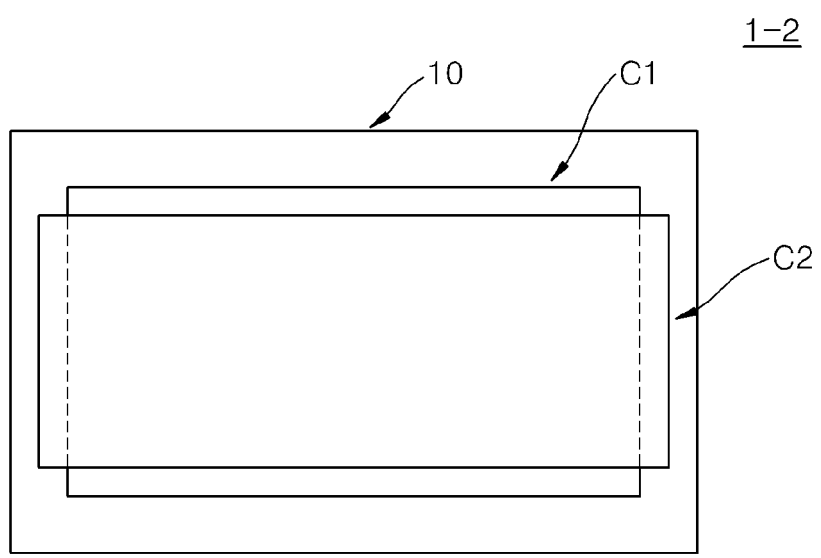
Figure 12:
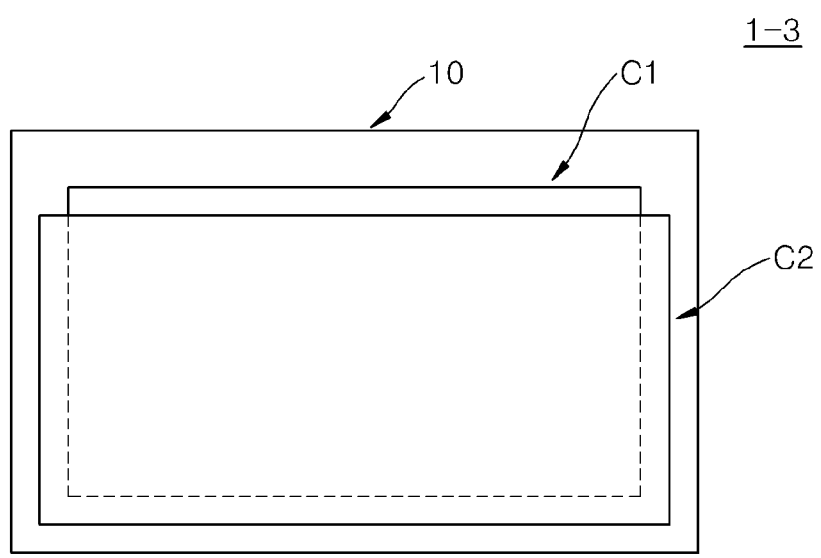

FIGS. 10 through 12 are exemplary planar arrangement views for illustrating aspects of the semiconductor package 1. In detail, FIGS. 10 through 12 are plan views for illustrating planar arrangements between the first semiconductor chip C1 and the second semiconductor chip C2 included in the semiconductor package 1. Accordingly, components other than the package base substrate 10, the first semiconductor chip C1, and the second semiconductor chip C2 are not illustrated.

Referring to FIG. 10, a semiconductor package 1-1 includes the package base substrate 10, and the first semiconductor chip C1 and the second semiconductor chip C2 sequentially stacked on the upper surface of the package base substrate 10. The area of the upper surface of the second semiconductor chip C2 is greater than that of the upper surface of the first semiconductor chip C1. For example, the second semiconductor chip C2 may cover the entire upper surface of the first semiconductor chip C1 as viewed from above the upper surface of the package base substrate 10, and at least one edge of the second semiconductor chip C2 (as shown in FIG. 10, all four edges) may extend beyond a respective edge of the first semiconductor chip C1.

Referring to FIG. 11, a semiconductor package 1-2 includes the package base substrate 10, and the first semiconductor chip C1 and the second semiconductor chip C2 sequentially stacked on the upper surface of the package base substrate 10. The width of the second semiconductor chip C2 in the first direction (for example, a horizontal direction in FIG. 11 from one edge of the second semiconductor chip C2 to an opposite edge) parallel to the upper surface of the package base substrate 10 may be greater than that of the first semiconductor chip C1. In the example of FIG. 11, the second semiconductor chip C2 may cover a portion of the upper surface of the first semiconductor chip C1 as viewed from above the upper surface of the package base substrate 10, with some of the upper surface of the first semiconductor chip C1 not being covered by and not vertically overlapping the second semiconductor chip C2, and part of the second semiconductor chip C2 overhanging the first semiconductor chip C1.

Referring to FIG. 12, a semiconductor package 1-3 includes the package base substrate 10, and the first semiconductor chip C1 and the second semiconductor chip C2 sequentially stacked on the upper surface of the package base substrate 10. The width of the second semiconductor chip C2 in the first direction (for example, the horizontal direction in FIG. 12) parallel to the upper surface of the package base substrate 10 may be greater than that of the first semiconductor chip C1. For example, the second semiconductor chip C2 may cover a portion of the upper surface of the first semiconductor chip C1 as viewed from above the upper surface of the package base substrate 10. As shown in FIG. 12, a width of the first semiconductor chip C1 in a second direction, for example perpendicular to the first direction, may be the same as a width in the same direction of the second semiconductor chip C2. In this case, the opposite edges of the two chips in the second direction may be vertically aligned with each other, or as shown in FIG. 12, they may not be aligned with each other.

Referring to FIGS. 10 through 12 together, at least a portion of the edge of the second semiconductor chip C2 included in the semiconductor package 1 may protrude beyond the edge of the first semiconductor chip C1, and thus the second semiconductor chip C2 may overhang the first semiconductor chip C1. Although two to four of the edges of the second semiconductor chip C2 protrude beyond the edge of the first semiconductor chip C1 in FIGS. 10 through 12, in certain embodiments, only one of the edges of the second semiconductor chip C2 protrude beyond the edge of the first semiconductor chip C1.

Referring to FIGS. 9 through 12 together, the first molding member 610 is disposed under a portion of the edge of the second semiconductor chip C2 that protrudes beyond the edge of the first semiconductor chip C1. Thus, when a mold (not shown) is attached onto the second semiconductor chip C2 and applies a pressure to the second semiconductor chip C2 during the formation of the second molding member 620, a mechanical damage to the portion of the second semiconductor chip C2 that protrudes beyond the edge of the first semiconductor chip C1 may be minimized.

By first forming the first molding member 610 and then forming the second molding member 620, a mechanical damage, such as a crack, may be prevented from being generated in the second semiconductor chip C2 in the case where the second semiconductor chip C2 overhangs the first semiconductor chip C1.

Figure 13:
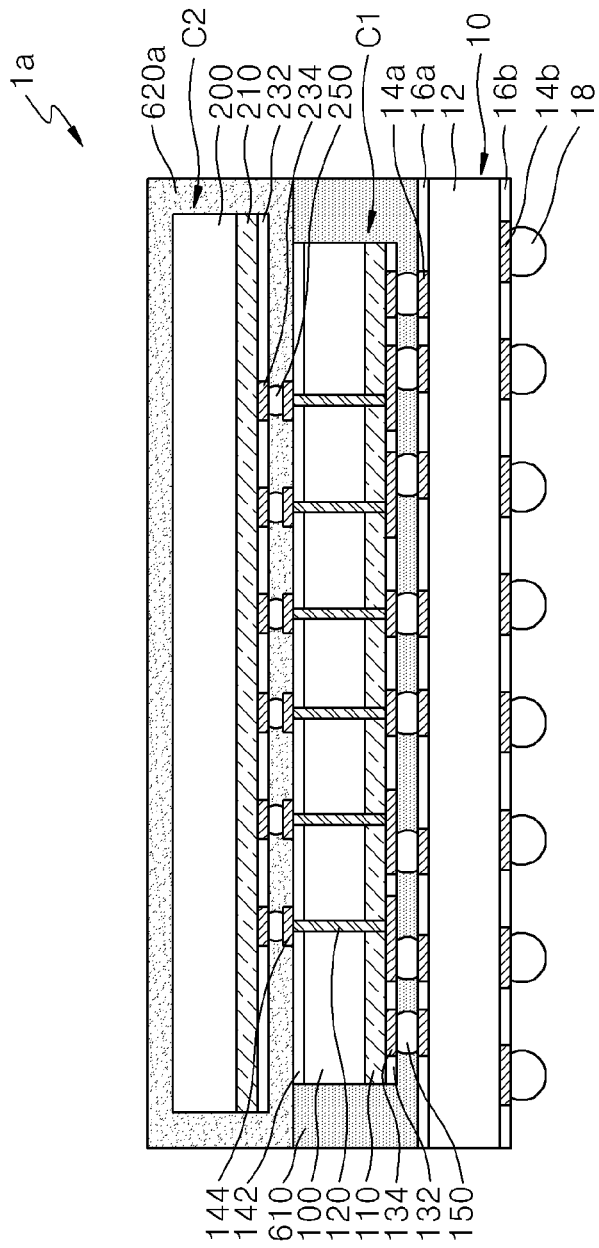
FIG. 13 is a cross-sectional view of a semiconductor package which is a modification of the semiconductor package of FIGS. 1-9, according to one exemplary embodiment.

FIG. 13 is an exemplary cross-sectional view of a semiconductor package 1a which is a modification of the semiconductor package 1 of FIGS. 1-9. The description of certain elements of the semiconductor package 1a of FIG. 13 that are the same as or similar to those of the semiconductor package 1 of FIG. 9 are omitted herein for brevity.

Referring to FIGS. 7 and 13, the semiconductor package 1a includes the package base substrate 10, and the first semiconductor chip C1 and the second semiconductor chip C2 sequentially stacked on the upper surface of the package base substrate 10.

After the second semiconductor chip C2 is stacked on the first semiconductor chip C1, a second molding member 620a is formed. The second molding member 620a may cover the upper surface and lateral surface of the second semiconductor chip C2. The second molding member 620a may cover the entire upper surface and entire lateral surface of the second semiconductor chip C2 and thus may completely cover the second semiconductor chip C2 from above.

Thus, the first semiconductor chip C1 and the second semiconductor chip C2 may be completely covered from above by the first molding member 610 and the second molding member 620a and thereby may be protected from external compacts or moisture.

Figure 16:
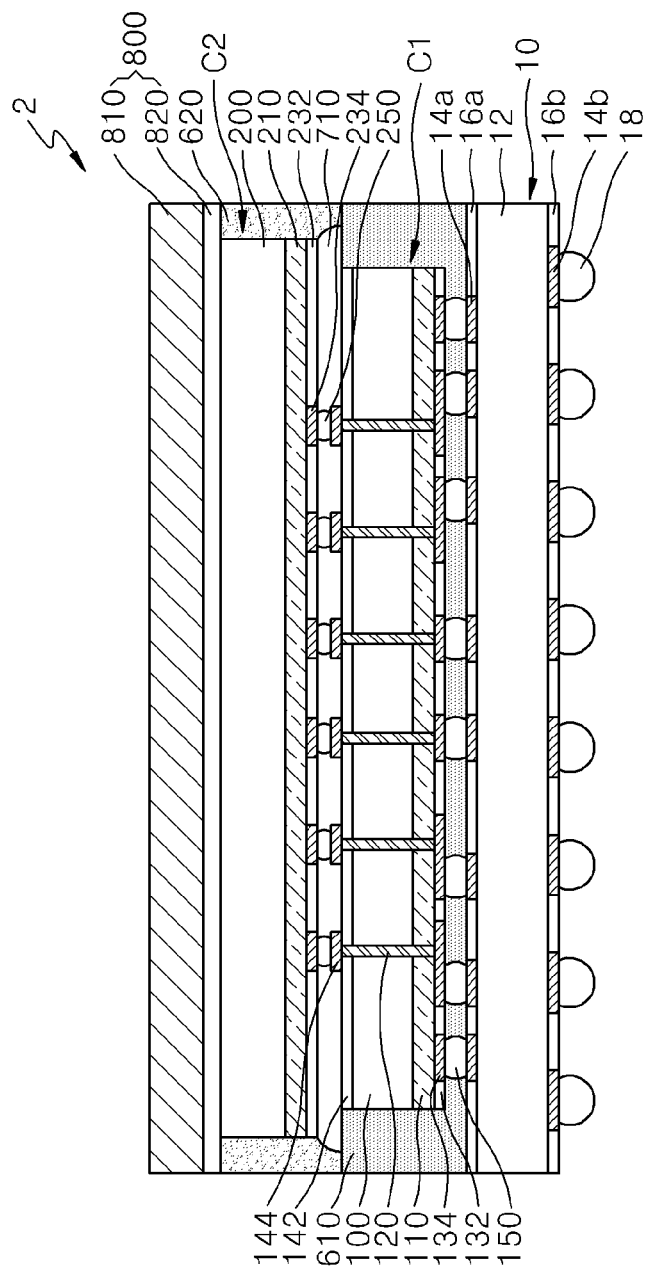

FIGS. 14 through 16 are exemplary cross-sectional views for explaining a method of manufacturing a semiconductor package 2 according to another embodiment of the inventive concept, and FIG. 16 is a cross-sectional view of the manufactured semiconductor package 2. In detail, FIG. 14 is a cross-sectional view for explaining operations subsequent to the operation of FIG. 7.

FIG. 14 is a cross-sectional view for explaining an operation of forming an underfill layer 710.

Referring to FIG. 14, the underfill layer 710 may be formed between the first semiconductor chip C1 and the second semiconductor chip C2 to fill the space between the first semiconductor chip C1 and the second semiconductor chip C2. The underfill layer 710 may be formed, for example, using a capillary underfill method.

The underfill layer 710 may be formed of epoxy resin, for example. The underfill layer 710 may include a filler or a flux. The filler may be formed of silica, for example. The filler may include particles having a size of, for example, about 0.1 μm to several μm, and may have an average size of about 0.3 to about 1 μm. The underfill layer 710 may include a filler having a mass of, for example, about 55% to about 75% of the total mass of the underfill layer 710. The percentage of the filler included in the underfill layer 710 may be about 55 wt % to about 75 wt %.

In one embodiment, the underfill layer 710 covers at least a portion of the upper surface of the first molding member 610 that is adjacent to the first semiconductor chip C1. A lateral surface of the underfill layer 710 may protrude beyond the lateral surface of the second semiconductor chip C2. A lower part of the portion of the underfill layer 710 protruding beyond the lateral surface of the second semiconductor chip C2 may protrude more than an upper part thereof.

FIG. 15 is a cross-sectional view for explaining an operation of forming the second molding member 620 included in the semiconductor package 2.

Referring to FIG. 15, the second molding member 620 is formed so as to cover the lateral surface of the second semiconductor chip C2, while exposing the upper surface, namely, the non-active surface, of the second semiconductor chip C2. The second molding member 620 may cover the entire lateral surface of the second semiconductor chip C2. In other words, the lateral surface of the second semiconductor chip C2 may be completely covered by the second molding member 620.

The portion of the underfill layer 710 protruding beyond the lateral surface of the second semiconductor chip C2 may be completely covered by the second molding member 620. Thus, the lateral surface of the second semiconductor chip C2 may be covered by the second molding member 620, and the bottom surface of the second semiconductor chip C2 may be covered by the underfill layer 710.

An upper surface of the second molding member 620 may be formed on the same plane as the upper surface of the second semiconductor chip C2. Therefore, the upper surface of the second molding member 620 may be formed at the same level as the upper surface of the second semiconductor chip C2 with respect to the upper surface of the package base substrate 10.

The lateral surface of the second molding member 620 may extend from the lateral surface of the first molding member 610 in the direction perpendicular to the upper surface of the package base substrate 10. As such, outer lateral surfaces of the second molding member 620 may be coplanar with outer lateral surfaces of the first molding member 610. The second molding member 620 may extend to an area that covers the entire upper surface of the first molding member 610.

In one embodiment, the second molding member 620 may be formed using the same method as the method of forming the first molding member 610, which has been described above with reference to FIGS. 3 through 5, and thus a detailed description thereof will be omitted.

FIG. 16 is a cross-sectional view of the semiconductor package 2. The description of elements of the semiconductor package 2 of FIG. 16 that are the same as those of the semiconductor package 1 of FIG. 9 may be omitted herein.

Referring to FIG. 16, the semiconductor package 2 includes the package base substrate 10, and the first semiconductor chip C1 and the second semiconductor chip C2 sequentially stacked on the upper surface of the package base substrate 10.

Referring to FIGS. 9 and 16 together, in the semiconductor package 2 illustrated in FIG. 16, the space between the first and second semiconductor chips C1 and C2 may be filled with the underfill layer 710 formed using a capillary underfill method, whereas in the semiconductor package 1 illustrated in FIG. 9, the space between the first and second semiconductor chips C1 and C2 may be filled with the second molding member 620 formed using an MUF process.

When the first molding member 610 and the second molding member 620 are not separately formed, but rather a single molding member is formed at once after the second semiconductor chip C2 is formed on the first semiconductor chip C1, the underfill layer 710 may contact the lateral surface of the first semiconductor chip C1. However, in the semiconductor package 2 according to the present embodiment, since the bottom surface of the underfill layer 710 contacts the upper surface of the first semiconductor chip C1 and the upper surface of the first molding member 610, the underfill layer 710 may not contact the lateral surface of the first semiconductor chip C1.

Figure 17:
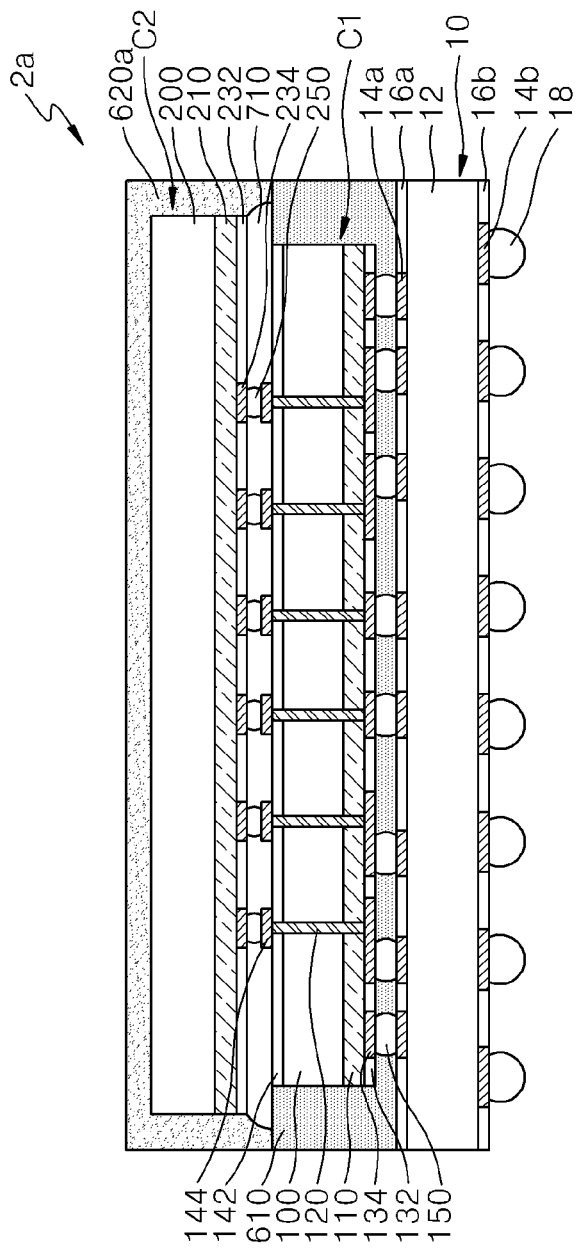
FIG. 17 is an exemplary cross-sectional view of a semiconductor package which is a modification of the semiconductor package of FIGS. 14-16.

FIG. 17 is an exemplary cross-sectional view of a semiconductor package 2a, which is a modification of the semiconductor package 2 of FIG. 16. The description of elements of the semiconductor package 2a of FIG. 17 that are the same or similar as those of the semiconductor package 2 of FIG. 16 may be omitted herein.

Referring to FIG. 17, the semiconductor package 2a includes the package base substrate 10, and the first semiconductor chip C1 and the second semiconductor chip C2 sequentially stacked on the upper surface of the package base substrate 10.

After the second semiconductor chip C2 is stacked on the first semiconductor chip C1, a second molding member 620a is formed. The second molding member 620a may cover the upper surface and lateral surface of the second semiconductor chip C2. The second molding member 620a may cover the entire upper surface and entire lateral surface of the second semiconductor chip C2 and thus may completely cover the second semiconductor chip C2 from above.

Thus, the first semiconductor chip C1 and the second semiconductor chip C2 may be completely covered by the first molding member 610 and the second molding member 620a and thereby may be protected from external compacts or moisture.

Figure 18:
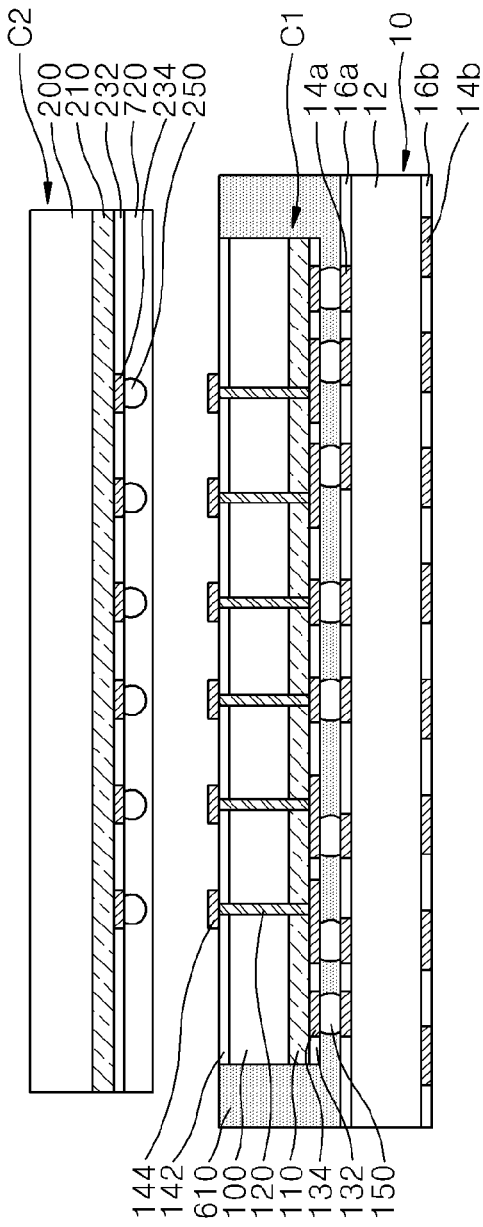
FIGS. 18 through 21 are cross-sectional views for explaining an exemplary method of manufacturing a semiconductor package according to another embodiment and a cross-sectional view of the manufactured semiconductor package.

FIGS. 18 through 21 are exemplary cross-sectional views for explaining a method of manufacturing a semiconductor package 3 according to another exemplary embodiment of the inventive concept, and an exemplary cross-sectional view of the manufactured semiconductor package 3. In detail, FIG. 18 is a cross-sectional view for explaining operations subsequent to the operation of FIG. 5.

FIG. 18 is a cross-sectional view of a second semiconductor chip C2 that is to be attached to a first semiconductor chip C1.

Referring to FIG. 18, in the second semiconductor chip C2, the second semiconductor device 210 is formed on the second semiconductor substrate 200. An underfill layer 720 may be attached to the bottom surface of the second semiconductor chip C2. The underfill layer 720 may be in the shape of a film, for example, a non-conductive film (NCF) or an anisotropic conductive film (ACF).

In a subsequent process, the underfill layer 720 may cover all of the second connection bumps 250 such as to completely fill the space between the first semiconductor chip C1 and the second semiconductor chip C2.

An NCF, which is a non-conductive film, is a common adhesive film and has an insulation property. When this NCF is used, an upper semiconductor chip may be stacked on a lower semiconductor chip by compression.

An ACF, which is an anisotropic conductive film, may have a structure in which conductive particles are distributed within an insulative adhesion film. The ACF may have an anisotropic electrical characteristic such that, when an upper chip contacts a lower chip, a current flows only between electrodes of the upper and lower chips, namely, in a vertical direction, and adjacent electrodes in each of the upper and lower chips, namely, in a horizontal direction, are insulated from each other. When an adhesive component of the ACF is melted by heat and compression, the conductive particles are arranged between facing electrodes (for example, between the second connection bumps 250 and the first rear pads 144) to thereby generate conductivity, whereas spaces between adjacent electrodes (for example, between the second connection bumps 250) are filled with the adhesive component and thus the adjacent electrodes are insulated from each other.

Figure 19:
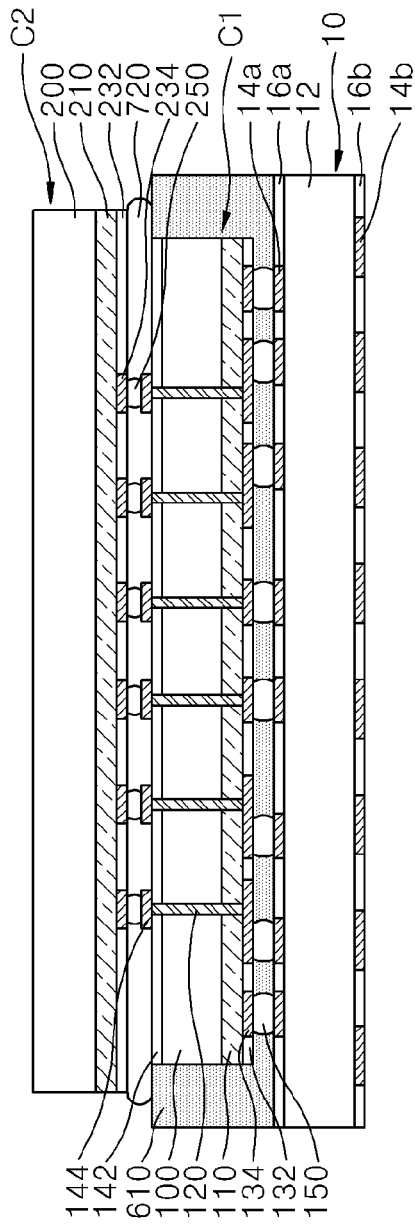

FIG. 19 is an exemplary cross-sectional view for explaining an operation of attaching the second semiconductor chip C2 onto the first semiconductor chip C1.

Referring to FIG. 19, the second semiconductor chip C2 is attached onto the first semiconductor chip C1. The second semiconductor chip C2 may be attached to the upper surface of the first semiconductor chip C1 and thus may be electrically connected to the first penetrating electrodes 120 of the first semiconductor chip C1.

The second semiconductor chip C2 may be attached onto the first semiconductor chip C1 and the first molding member 610 such that the active surface, for example, the front surface, of the second semiconductor chip C2, on which the second semiconductor device 210 has been formed, faces the first semiconductor chip C1.

The space between the first semiconductor chip C1 and the second semiconductor chip C2 may be filled with the underfill layer 720 having a film shape and which is attached to the bottom surface, namely, the active surface, of the second semiconductor chip C2.

The underfill layer 720 may cover a portion of the upper surface of the first molding member 610 that is adjacent to the first semiconductor chip C1. The second semiconductor chip C2 may be attached onto the first semiconductor chip C1 by compression. In this case, a lateral surface of the underfill layer 720 may protrude beyond the second semiconductor chip C2. The portion of the underfill layer 720 protruding outwards from the second semiconductor chip C2 may protrude, for example, convexly from the lateral surface of the second semiconductor chip C2.

Figure 20:
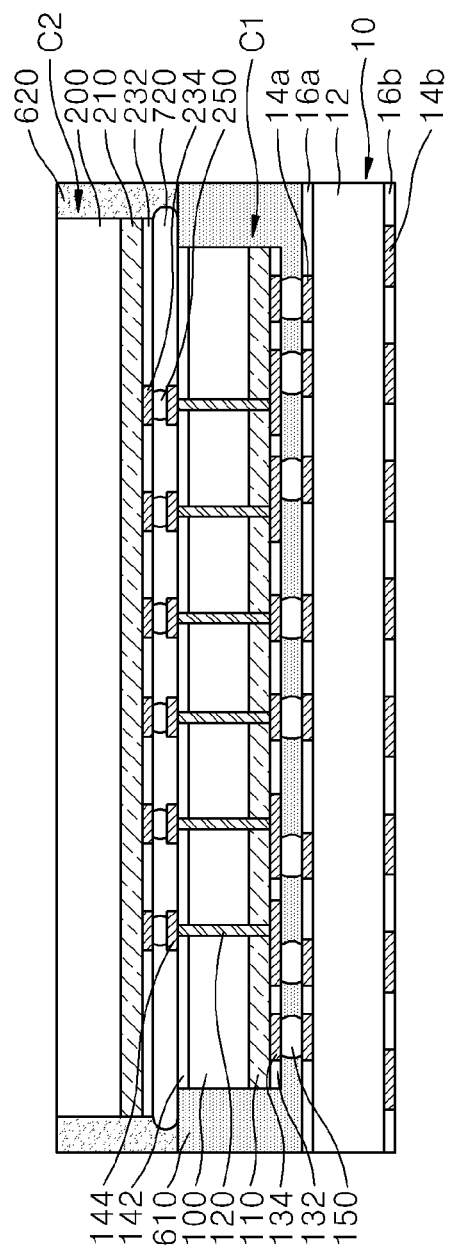

FIG. 20 is a cross-sectional view for explaining an operation of forming a second molding member 620 included in the semiconductor package 3.

Referring to FIG. 20, the second molding member 620 is formed so as to cover the lateral surface of the second semiconductor chip C2, while exposing the upper surface, namely, the non-active surface, of the second semiconductor chip C2. The second molding member 620 may cover the entire lateral surface of the second semiconductor chip C2. In other words, the lateral surface of the second semiconductor chip C2 may be completely covered by the second molding member 620.

The portion of the underfill layer 720 protruding beyond the lateral surface of the second semiconductor chip C2 may be completely covered by the second molding member 620. Thus, the lateral surface of the second semiconductor chip C2 may be covered by the second molding member 620, and the bottom surface of the second semiconductor chip C2 may be covered by the underfill layer 720.

An upper surface of the second molding member 620 may be formed on the same plane as the upper surface of the second semiconductor chip C2. Therefore, the upper surface of the second molding member 620 may be formed on the same level as the upper surface of the second semiconductor chip C2 with respect to the upper surface of the package base substrate 10.

The lateral surface of the second molding member 620 may extend from the lateral surface of the first molding member 610 in the direction perpendicular to the upper surface of the package base substrate 10. The second molding member 620 may completely cover a portion of the upper surface of the first molding member 610 that is exposed outside the underfill layer 720.

In one embodiment, the second molding member 620 may be formed using the same method as the method of forming the first molding member 610, which has been described above with reference to FIGS. 3 through 5, and thus a detailed description thereof will be omitted.

Figure 21:
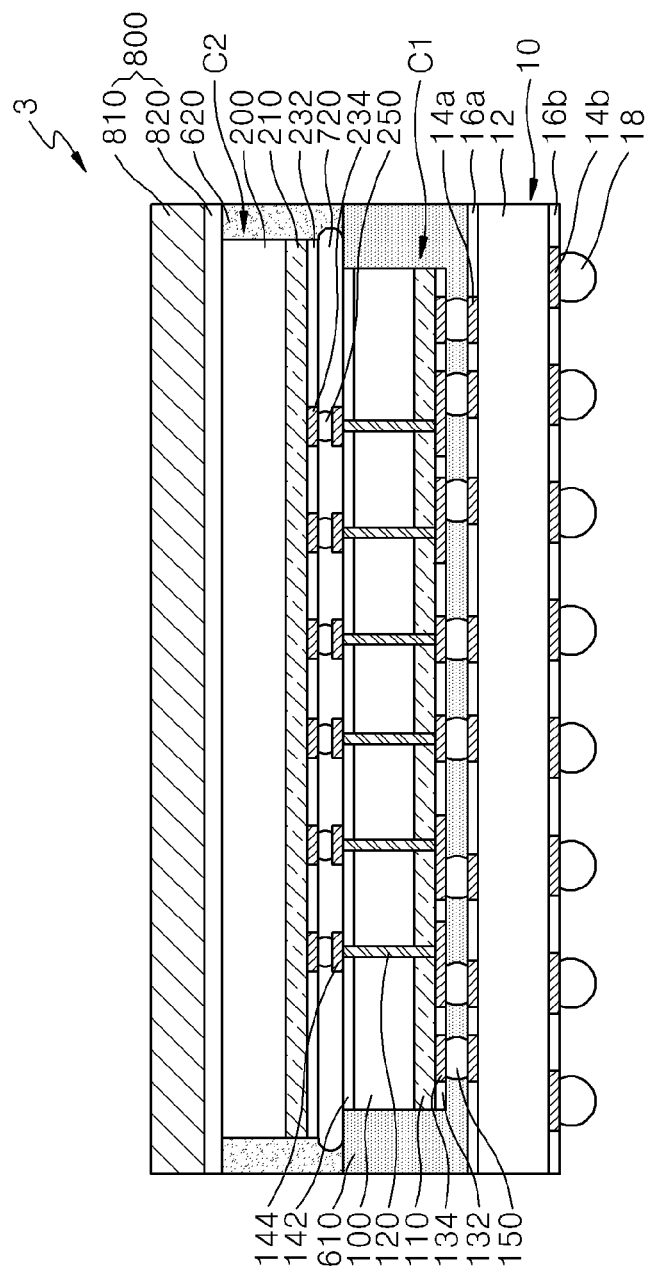

FIG. 21 is a cross-sectional view of the semiconductor package 3. The description of elements of the semiconductor package 3 illustrated in FIG. 21 which are the same as those of the semiconductor packages 1 and 2 illustrated in FIGS. 9 and 16 may be omitted herein.

Referring to FIG. 21, the semiconductor package 3 includes the package base substrate 10, and the first semiconductor chip C1 and the second semiconductor chip C2 sequentially stacked on the upper surface of the package base substrate 10.

Referring to FIGS. 9, 16, and 21 together, in the semiconductor package 3 illustrated in FIG. 21, the space between the first and second semiconductor chips C1 and C2 may be filled with the underfill layer 720 in a film shape, in the semiconductor package 2 illustrated in FIG. 16, the space between the first and second semiconductor chips C1 and C2 may be filled with the underfill layer 710 formed using a capillary underfill method, and in the semiconductor package 1 illustrated in FIG. 9, the space between the first and second semiconductor chips C1 and C2 may be filled with the second molding member 620 formed, for example, using an MUF process.

When the first molding member 610 and the second molding member 620 are not separately formed, but rather a single molding member is formed at once after the second semiconductor chip C2 is formed on the first semiconductor chip C1, the underfill layer 720 may contact the lateral surface of the first semiconductor chip C1. However, in the semiconductor package 3 according to the present embodiment, since the bottom surface of the underfill layer 720 contacts the upper surface of the first semiconductor chip C1 and the upper surface of the first molding member 610, the underfill layer 720 does not contact the lateral surface of the first semiconductor chip C1.

Figure 22:
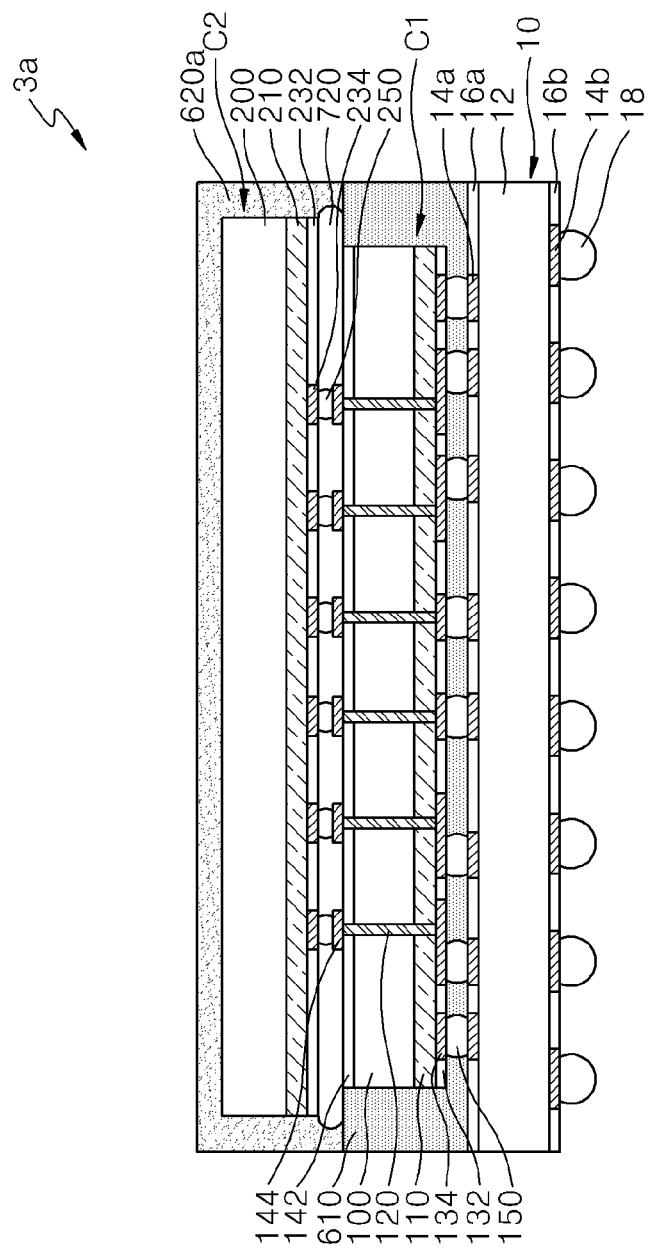
FIG. 22 is an exemplary cross-sectional view of a semiconductor package which is a modification of the semiconductor package of FIGS. 18-21.

FIG. 22 is a cross-sectional view of a semiconductor package 3a, which is a modification of the semiconductor package 3 of FIG. 21. The description of elements of the semiconductor package 3a of FIG. 22 which are the same as those of the semiconductor package 3 of FIG. 21 may be omitted herein.

Referring to FIG. 22, the semiconductor package 3a includes the package base substrate 10, and the first semiconductor chip C1 and the second semiconductor chip C2 sequentially stacked on the upper surface of the package base substrate 10.

After the second semiconductor chip C2 is stacked on the first semiconductor chip C1, a second molding member 620a is formed. The second molding member 620a may cover the upper surface and lateral surface of the second semiconductor chip C2. The second molding member 620a may cover the entire upper surface and entire lateral surface of the second semiconductor chip C2 and thus may completely cover the second semiconductor chip C2 from above.

Thus, the first semiconductor chip C1 and the second semiconductor chip C2 may be completely covered by the first molding member 610 and the second molding member 620a and thereby may be protected from external compacts or moisture.

Planar arrangements between the first and second semiconductor chips C1 and C2 of each of the semiconductor packages 1a, 2, 2a, 3, and 3a of FIGS. 13, 16, 17, 21, and 22 may be the same as those of the semiconductor packages 1-1, 1-2, and 1-3 of FIGS. 10 through 12, and thus a detailed description thereof will be omitted.

FIGS. 23 through 39 are cross-sectional views of exemplary semiconductor packages 4, 4a, 5, 5a, 6, 7, 8, and 8a according to embodiments of the inventive concept, and plan views of aspects of the semiconductor packages 8 and 8a. In detail, FIGS. 23 through 39 are cross-sectional views of the semiconductor packages 4, 4a, 5, 5a, 6, 7, 8, and 8a each including three semiconductor chips, namely, first, second, and third semiconductor chips C1, C2, and C3, and planar arrangement views for illustrating aspects of the semiconductor packages 7, 8 and 8a.

Figure 23:
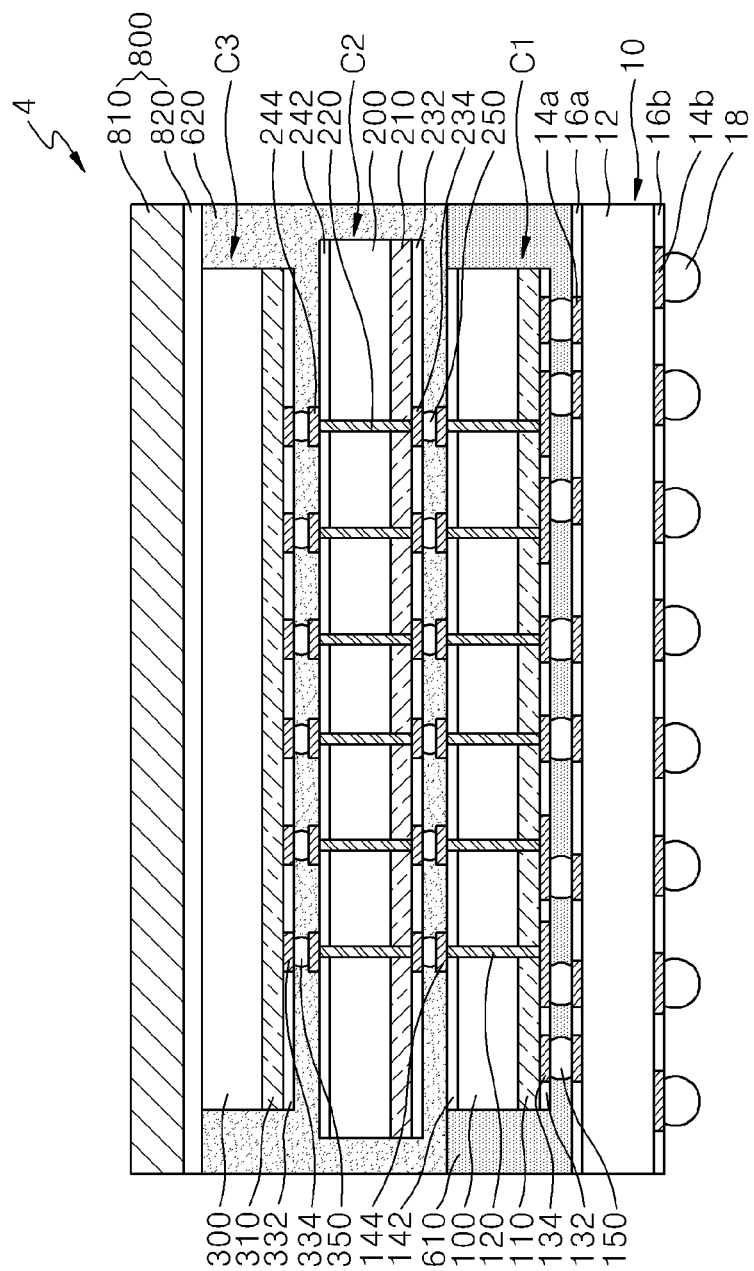
FIGS. 23 through 39 are cross-sectional views of exemplary semiconductor packages according to other embodiments, and plan views for illustrating aspects of the semiconductor packages.

FIG. 23 is a cross-sectional view of the semiconductor package 4.

Referring to FIG. 23, the semiconductor package 4 includes the package base substrate 10, and the first, second, and third semiconductor chips C1, C2, and C3 sequentially stacked on the upper surface of the package base substrate 10.

The second semiconductor chip C2 includes second penetrating electrodes 220, a second rear protection layer 242, and second rear pads 244, similar to the first semiconductor chip C1 including the first penetrating electrodes 120, the first rear protection layer 142, and the first rear pads 144, and the third semiconductor chip C3 has a similar structure to the structure of the second semiconductor chip C2 of FIG. 9. Thus, detailed descriptions of the second and third semiconductor chips C2 and C3 will be omitted.

The third semiconductor chip C3 may be electrically connected to the package base substrate 10 via the first and second penetrating electrodes 120 and 220. Some of the first penetrating electrodes 120 may be electrically connected to the second semiconductor chip C2, and the remaining ones of the first penetrating electrodes 120 may be electrically connected to the third semiconductor chip C3 via the second penetrating electrodes 220.

An area of the upper surface of the second semiconductor chip C2 may be greater than that of the upper surface of the first semiconductor chip C1. Alternatively, or additionally a width of the second semiconductor chip C2 in a first direction (for example, a horizontal direction in FIG. 23) parallel to the upper surface of the package base substrate 10 may be greater than that of the first semiconductor chip C1.

An area of the upper surface of the second semiconductor chip C2 may be greater than that of the upper surface of the third semiconductor chip C3. For example, the second semiconductor chip C2 may cover the entire bottom surface of the third semiconductor chip C3 as viewed from above the upper surface of the package base substrate 10.

Accordingly, the second semiconductor chip C2 may protrude beyond the first semiconductor chip C1, but the third semiconductor chip C3 may not protrude beyond the second semiconductor chip C2.

The first molding member 610 may cover the first semiconductor chip C1. The second molding member 620 may cover the second and third semiconductor chips C2 and C3.

Therefore, when an upper chip (for example, the second semiconductor chip C2) stacked on a lower chip (for example, the first semiconductor chip C1) protrudes beyond the lower chip, a lower molding member (for example, the first molding member 610) covering the lower chip and an upper molding member (for example, the second molding member 620) covering the upper chip may be formed separately.

On the other hand, when an upper chip (for example, the third semiconductor chip C3) stacked on a lower chip (for example, the second semiconductor chip C2) does not protrude beyond the lower chip, a single molding member (for example, the second molding member 620) covering both the upper and lower chips may be formed.

Figure 24:
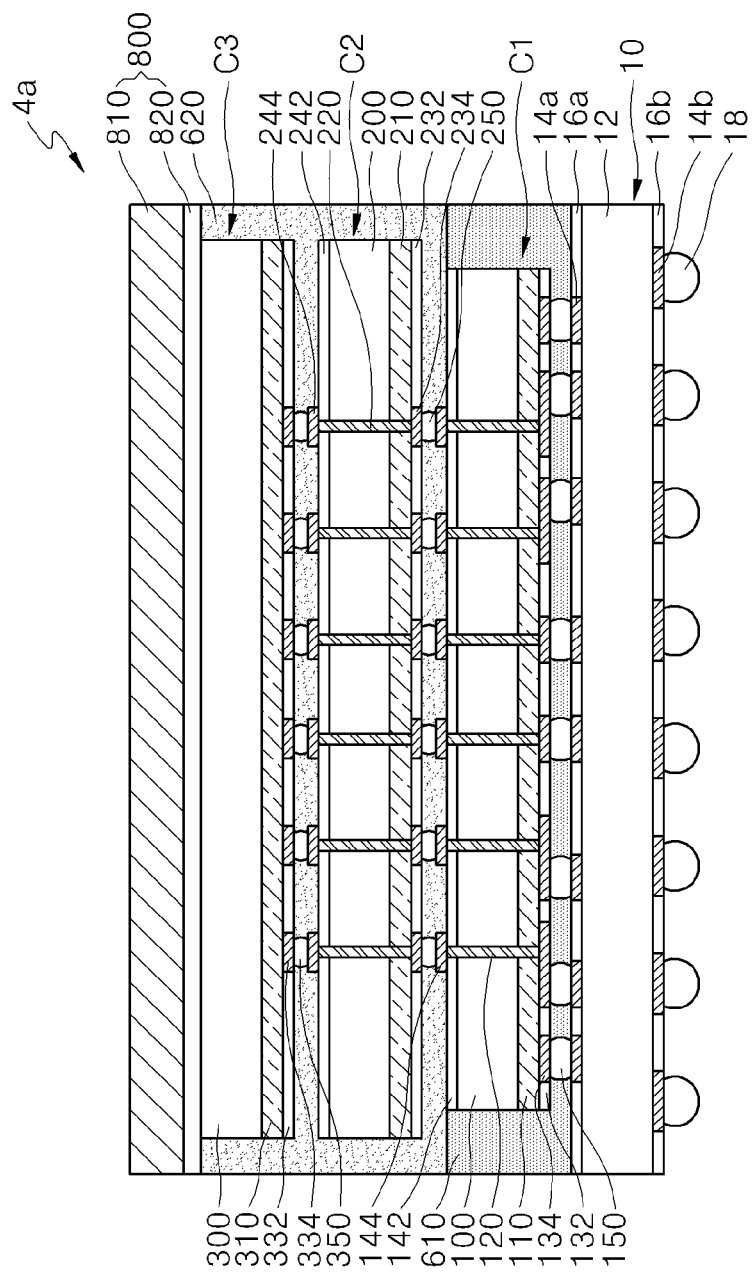

FIG. 24 is a cross-sectional view of a semiconductor package 4a, which is a modification of the semiconductor package 4 of FIG. 23.

Referring to FIG. 24, the semiconductor package 4a includes the package base substrate 10, and first, second, and third semiconductor chips C1, C2, and C3 sequentially stacked on the upper surface of the package base substrate 10.

An area of the upper surface of the second semiconductor chip C2 may be greater than that of the upper surface of the first semiconductor chip C1. Alternatively, or additionally, a width of the second semiconductor chip C2 in a first direction (for example, a horizontal direction in FIG. 24) parallel to the upper surface of the package base substrate 10 may be greater than that of the first semiconductor chip C1.

An area of the upper surface of the third semiconductor chip C3 may be equal to that of the upper surface of the second semiconductor chip C2. For example, the second and third semiconductor chips C2 and C3 may overlap and may have edges vertically aligned with each other as view from above the upper surface of the package base substrate 10.

Therefore, the second semiconductor chip C2 may protrude beyond the first semiconductor chip C1, but the third semiconductor chip C3 may not protrude beyond the second semiconductor chip C2.

Since the third semiconductor chip C3 does not protrude beyond the second semiconductor chip C2, a single molding member that covers both the second semiconductor chip C2 and the third semiconductor chip C3, namely, only the second molding member 620, may be formed.

Also, as shown in FIG. 24, an interface between the first molding member 610 and the second molding member 620 is coplanar with a bottom surface of the second semiconductor chip C2 (e.g., a bottom surface of second front protection layer 232), rather than a top surface of the first semiconductor chip C1.

Figure 25:
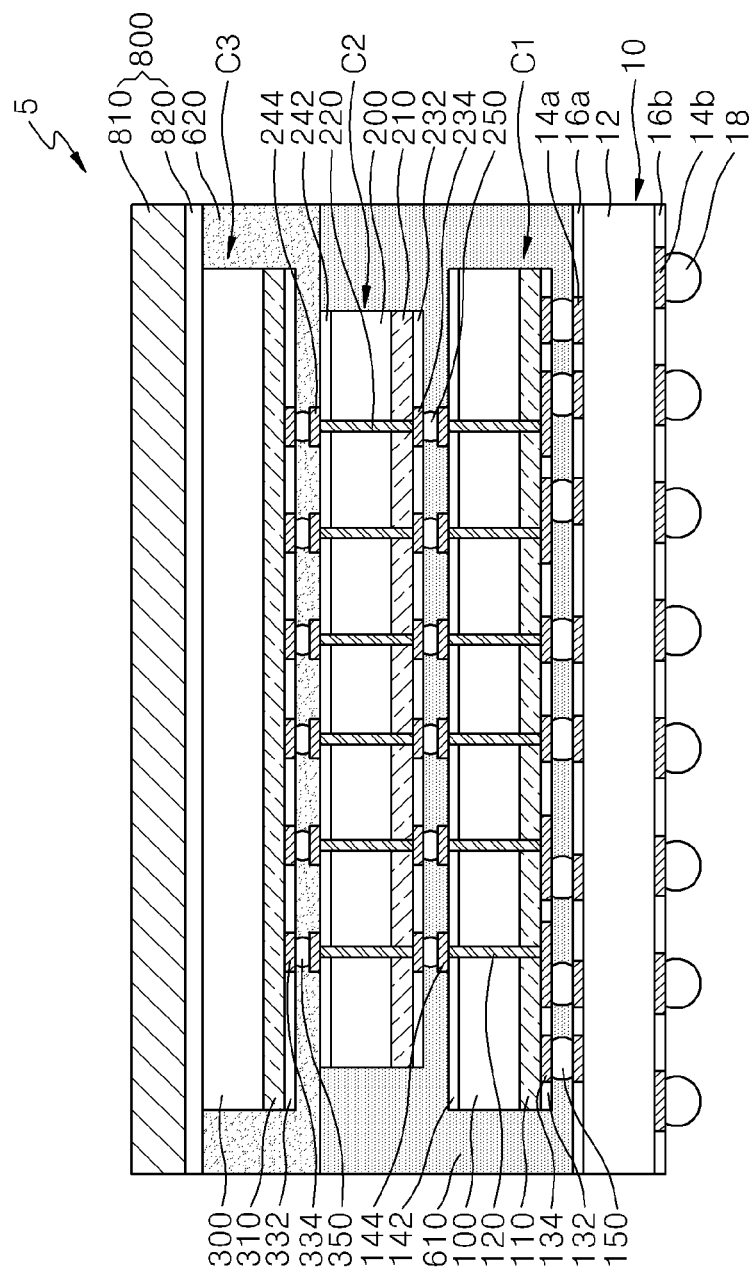

FIG. 25 is an exemplary cross-sectional view of a semiconductor package 5 according to another embodiment of the inventive concept.

Referring to FIG. 25, the semiconductor package 5 includes the package base substrate 10, and first, second, and third semiconductor chips C1, C2, and C3 sequentially stacked on the upper surface of the package base substrate 10. A repeated description of matters described above with reference to FIG. 23 is omitted herein.

An area of the upper surface of the second semiconductor chip C2 may be smaller than that of the upper surface of the first semiconductor chip C1. For example, the first semiconductor chip C1 may cover the entire bottom surface of the second semiconductor chip C2 as viewed from above the upper surface of the package base substrate 10.

An area of the upper surface of the third semiconductor chip C3 may be greater than that of the upper surface of the second semiconductor chip C2. Alternatively, or additionally, a width of the third semiconductor chip C3 in a first direction (for example, a horizontal direction in FIG. 25) parallel to the upper surface of the package base substrate 10 may be greater than that of the second semiconductor chip C2.

As such, the third semiconductor chip C3 may protrude beyond the second semiconductor chip C2, but the second semiconductor chip C2 may not protrude beyond the first semiconductor chip C1.

Since the second semiconductor chip C2 does not protrude beyond the first semiconductor chip C1, a single molding member that covers both the first semiconductor chip C1 and the second semiconductor chip C2, namely, only the first molding member 610, may be formed.

The first molding member 610 may cover the first and second semiconductor chips C1 and C2. The second molding member 620 may cover the third semiconductor chip C3.

Figure 26:
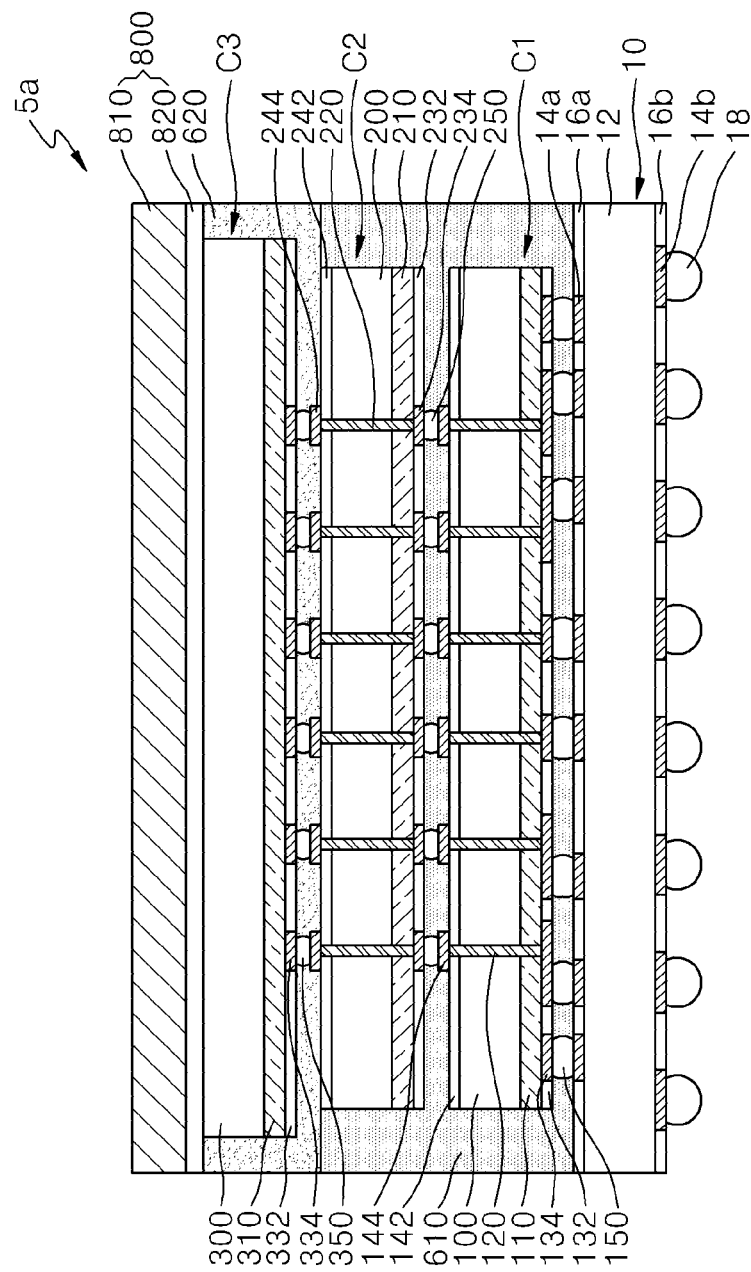

FIG. 26 is a cross-sectional view of an exemplary semiconductor package 5a, which is a modification of the semiconductor package 5 of FIG. 25.

Referring to FIG. 26, the semiconductor package 5a includes the package base substrate 10, and first, second, and third semiconductor chips C1, C2, and C3 sequentially stacked on the upper surface of the package base substrate 10.

An area of the upper surface of the second semiconductor chip C2 may be equal to that of the upper surface of the first semiconductor chip C1. For example, the first and second semiconductor chips C2 and C3 may overlap each other as viewed from above the upper surface of the package base substrate 10.

An area of the upper surface of the third semiconductor chip C3 may be greater than that of the upper surface of the second semiconductor chip C2. Alternatively, or additionally, a width of the third semiconductor chip C3 in a first direction (for example, a horizontal direction in FIG. 26) parallel to the upper surface of the package base substrate 10 may be greater than that of the second semiconductor chip C2.

Therefore, the third semiconductor chip C3 may protrude beyond the second semiconductor chip C2, but the second semiconductor chip C2 may not protrude beyond the first semiconductor chip C1.

Since the second semiconductor chip C2 does not protrude beyond the first semiconductor chip C1, a single molding member that covers both the first semiconductor chip C1 and the second semiconductor chip C2, namely, only the first molding member 610, may be formed.

The first molding member 610 may cover the first and second semiconductor chips C1 and C2. The second molding member 620 may cover the third semiconductor chip C3.

Figure 27:
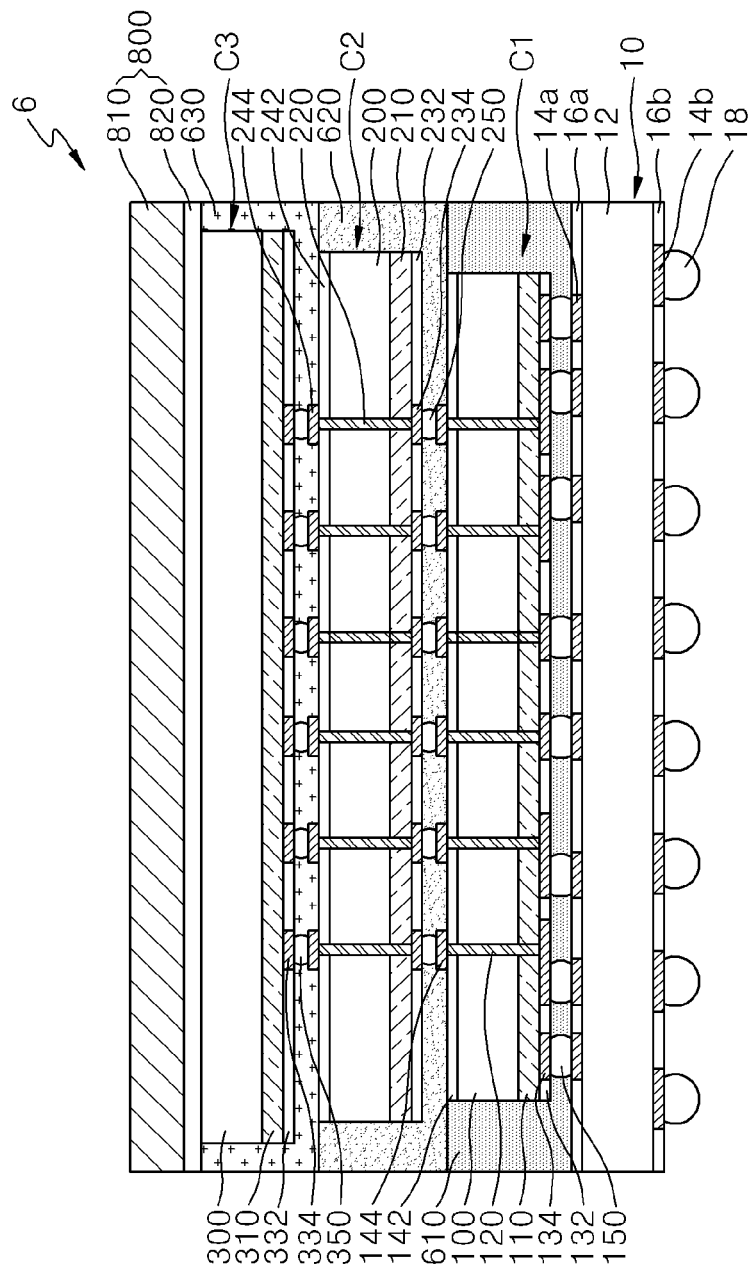

FIG. 27 is a cross-sectional view of an exemplary semiconductor package 6 according to another embodiment of the inventive concept.

Referring to FIG. 27, the semiconductor package 6 includes the package base substrate 10, and first, second, and third semiconductor chips C1, C2, and C3 sequentially stacked on the upper surface of the package base substrate 10.

An area of the upper surface of the second semiconductor chip C2 may be greater than that of the upper surface of the first semiconductor chip C1. Alternatively, or additionally, a width of the second semiconductor chip C2 in a first direction (for example, a horizontal direction in FIG. 27) parallel to the upper surface of the package base substrate 10 may be greater than that of the first semiconductor chip C1.

An area of the upper surface of the third semiconductor chip C3 may be greater than that of the upper surface of the second semiconductor chip C2. Alternatively, or additionally, a width of the third semiconductor chip C3 in a first direction (for example, a horizontal direction in FIG. 27)

parallel to the upper surface of the package base substrate 10 may be greater than that of the second semiconductor chip C2.

Therefore, the third semiconductor chip C3 may protrude beyond the second semiconductor chip C2, and the second semiconductor chip C2 may protrude beyond the first semiconductor chip C1. Thus, molding members that respectively cover the first, second, and third semiconductor chips C1, C2, and C3 may be formed separately.

A first molding member 610 may cover the first semiconductor chip C1. A second molding member 620 may cover the second semiconductor chip C2. A third molding member 630 may cover the third semiconductor chip C3. The first molding member 610 may be formed prior to the second semiconductor chip C2 being attached to the first semiconductor chip C1, the second molding member 620 may be formed prior to the third semiconductor chip C3 being attached to the second semiconductor chip C2, and the third molding member 630 may be formed after the third semiconductor chip C3 is attached to the second semiconductor chip C2.

Planar arrangements between a lower chip and an upper chip that protrudes beyond the lower chip, in each of the semiconductor packages 4, 4a, 5, 5a, and 6 of FIGS. 23-27, may be the same as those of the semiconductor packages 1-1, 1-2, and 1-3 of FIGS. 10-12, and thus a repeated description thereof will be omitted.

Figure 28:
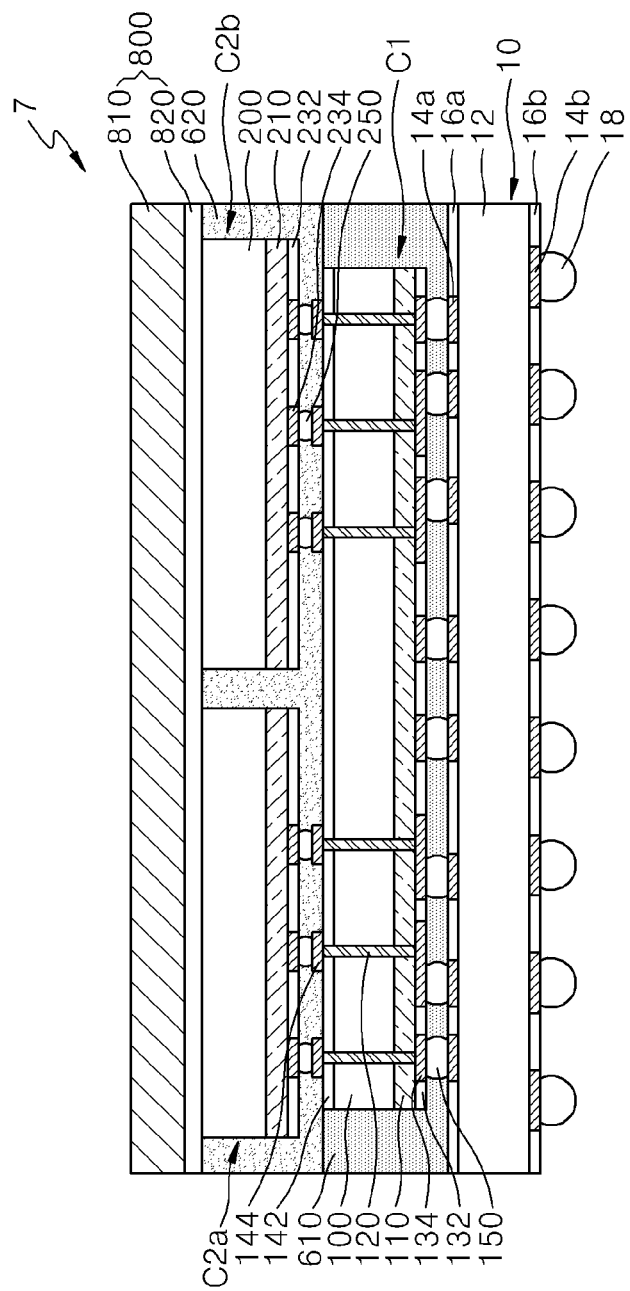

FIG. 28 is an exemplary cross-sectional view of a semiconductor package 7 according to another embodiment of the inventive concept.

Referring to FIG. 28, the semiconductor package 7 includes the package base substrate 10, a first semiconductor chip C1 attached to the upper surface of the package base substrate 10, and two second semiconductor chips C2a and C2b stacked on the first semiconductor chip C1.

The second semiconductor chip C2a may be formed at the same level as the second semiconductor chip C2b with respect to the upper surface of the package base substrate 10.

An area of the upper surface of each of the two second semiconductor chips C2a and C2b may be greater than, equal to, or smaller than that of the upper surface of the first semiconductor chip C1. However, when the two second semiconductor chips C2a and C2B are attached to the upper surface of the first semiconductor chip C1, one or both of the two second semiconductor chips C2a and C2b may protrude beyond the first semiconductor chip C1.

Thus, a first molding member 610 that covers the first semiconductor chip C1, and a second molding member 620 that covers the two second semiconductor chips C2a and C2b may be separately formed.

The first molding member 610 may cover the first semiconductor chip C1. The second molding member 620 may cover the two second semiconductor chips C2a and C2b.

Figure 29:
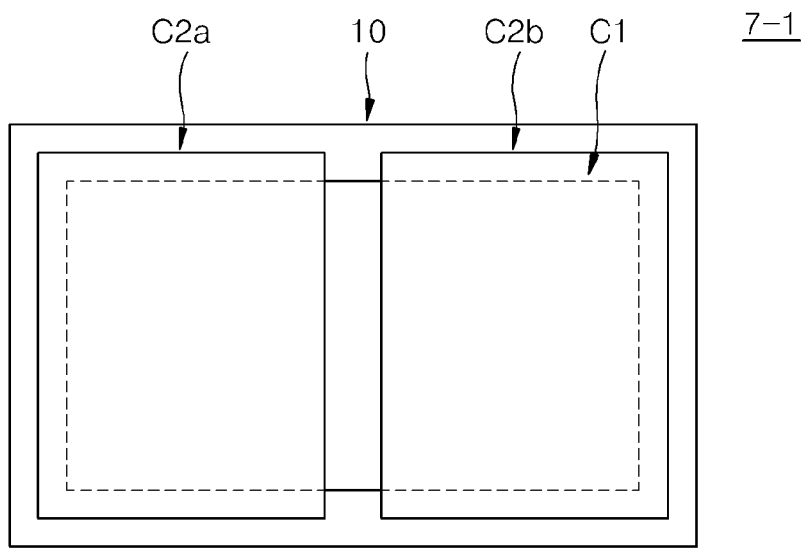
Figure 30:
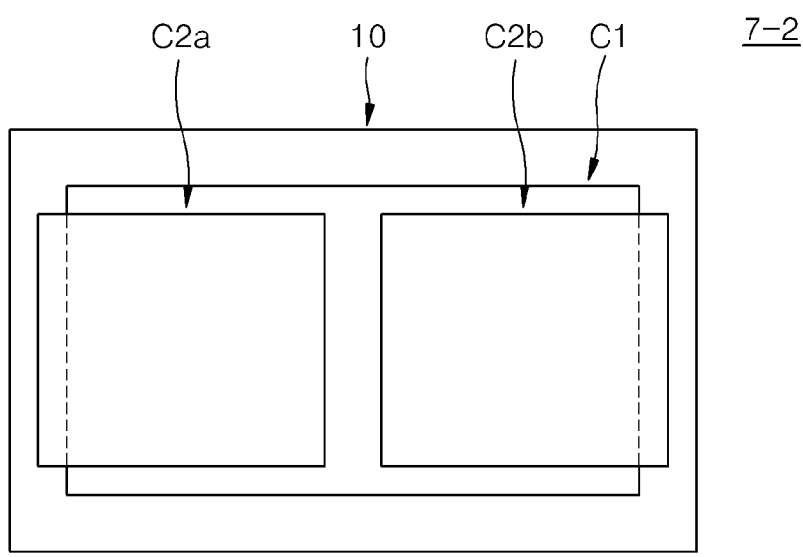
Figure 31:
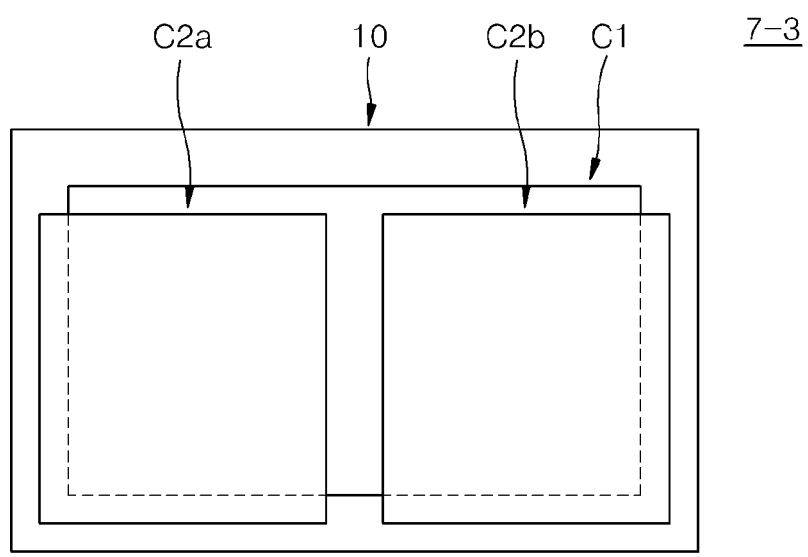

FIGS. 29 through 31 are exemplary planar arrangement views for illustrating aspects of the semiconductor package 7 of FIG. 28. In detail, FIGS. 29 through 31 are plan views for illustrating planar arrangements between the first semiconductor chip C1 and the two second semiconductor chips C2 included in the semiconductor package 7. Accordingly, components other than the package base substrate 10, the first semiconductor chip C1, and the second semiconductor chips C2a and C2b are not illustrated.

Referring to FIG. 29, a semiconductor package 7-1 includes the package base substrate 10, a first semiconductor chip C1 stacked on the upper surface of the package base substrate 10, and two second semiconductor chips C2a and C2b stacked on the upper surface of the first semiconductor chip C1. The two second semiconductor chips C2a and C2b may cover the entire upper surface of the first semiconductor chip C1 except for a portion thereof between the two second semiconductor chips C2a and C2b, as viewed from above the upper surface of the package base substrate 10.

Accordingly, three of the four edges of each of the two second semiconductor chips C2a and C2b may respectively protrude beyond three of the four edges of the first semiconductor chip C1.

Referring to FIG. 30, a semiconductor package 7-2 includes the package base substrate 10, a first semiconductor chip C1 stacked on the upper surface of the package base substrate 10, and two second semiconductor chips C2a and C2b stacked on the upper surface of the first semiconductor chip C1.

One of the four edges of each of the two second semiconductor chips C2a and C2b may protrude beyond one of the four edges of the first semiconductor chip C1.

Referring to FIG. 31, a semiconductor package 7-3 includes the package base substrate 10, a first semiconductor chip C1 stacked on the upper surface of the package base substrate 10, and two second semiconductor chips C2a and C2b stacked on the upper surface of the first semiconductor chip C1.

Two of the four edges of each of the two second semiconductor chips C2a and C2b may respectively protrude beyond two of the four edges of the first semiconductor chip C1.

Although two to four of the edges of each of the two second semiconductor chips C2a and C2b may respectively protrude beyond two to four of the edges of the first semiconductor chip C1 in FIGS. 29 through 31, an edge of only one of the two second semiconductor chips C2a and C2b may protrude beyond an edge of the first semiconductor chip C1. The number of edges of the second semiconductor chip C2a that respectively protrude beyond edges of the first semiconductor chip C1 may be different from the number of edges of the second semiconductor chip C2b that respectively protrude beyond edges of the first semiconductor chip C1.

Figure 32:
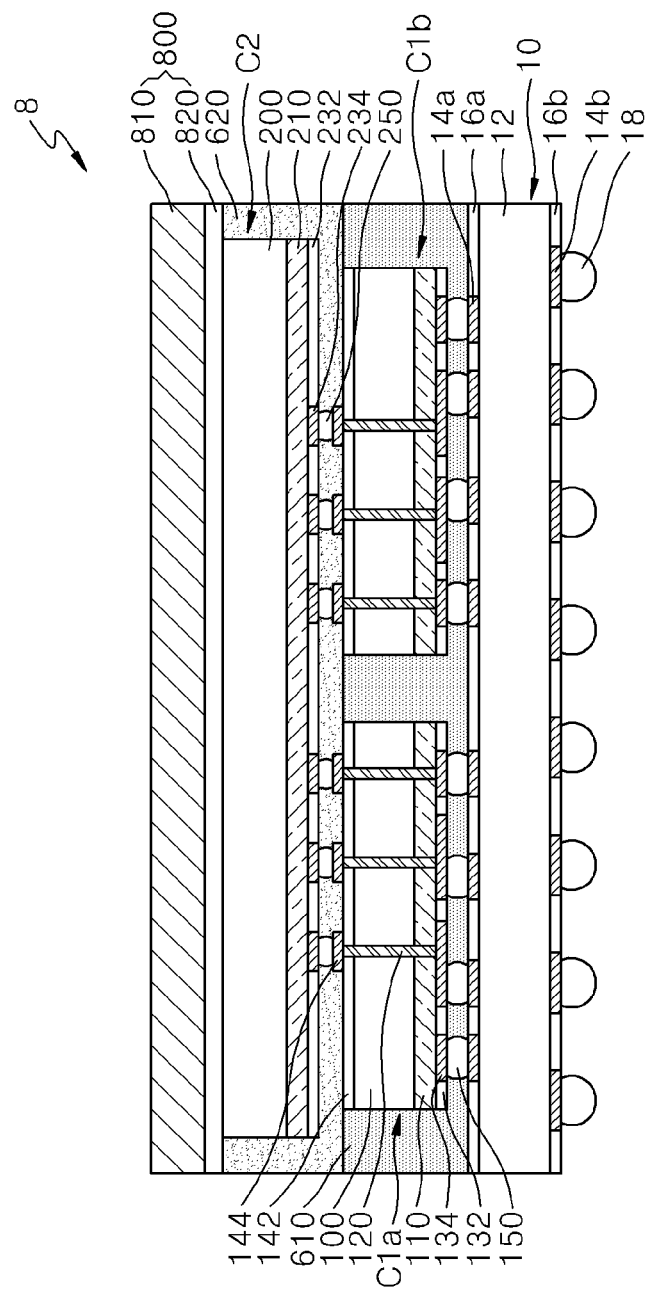

FIG. 32 is an exemplary cross-sectional view of a semiconductor package 8 according to another embodiment of the inventive concept.

Referring to FIG. 32, the semiconductor package 8 includes the package base substrate 10, two first semiconductor chips C1a and C1b attached to the upper surface of the package base substrate 10, and a second semiconductor chip C2 stacked on the upper surfaces of the two first semiconductor chips C1a and C1b.

The first semiconductor chip C1a may be formed on the same level as the first semiconductor chip C1b with respect to the upper surface of the package base substrate 10.

The second semiconductor chip C2 may protrude beyond edges of both the two first semiconductor chips C1a and C1b or from edges of one of the two first semiconductor chips C1a and C1b.

Thus, a first molding member 610 that covers the two first semiconductor chips C1a and C1b, and a second molding member 620 that covers the second semiconductor chip C2 may be separately formed.

The first molding member 610 may cover the two first semiconductor chips C1a and C1b. The second molding member 620 may cover the second semiconductor chip C2.

Figure 33:
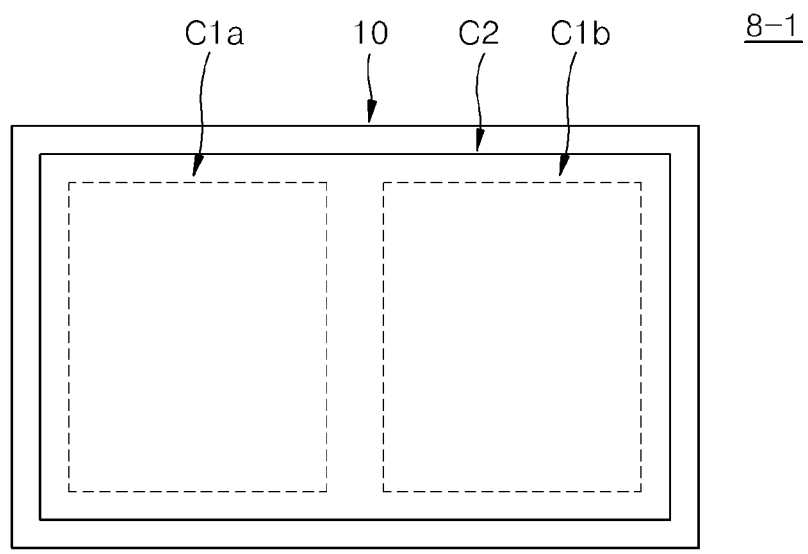
Figure 34:
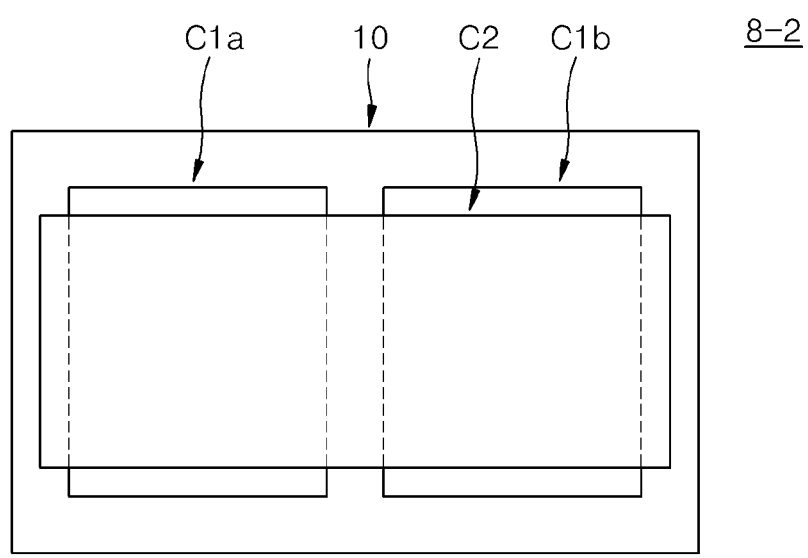
Figure 35:
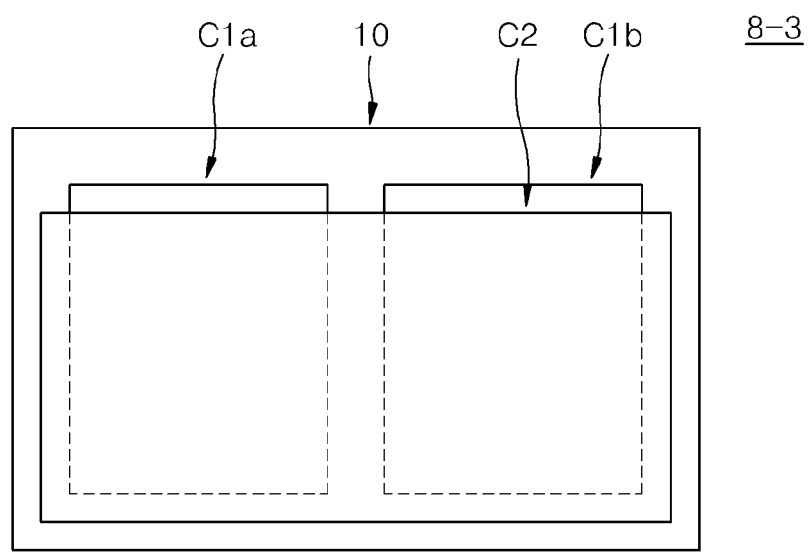

FIGS. 33 through 35 are exemplary planar arrangement views for illustrating aspects of the semiconductor package 8 of FIG. 32. In detail, FIGS. 33 through 35 are plan views for illustrating planar arrangements between the two first semiconductor chips C1a and C1b and the second semiconductor chip C2 included in the semiconductor package 8 of FIG. 32. Accordingly, components other than the package base substrate 10, the two first semiconductor chips C1a and C1b, and the second semiconductor chip C2 are not illustrated.

Referring to FIG. 33, a semiconductor package 8-1 includes the package base substrate 10, two first semiconductor chips C1a and C1b attached to the upper surface of the package base substrate 10, and a second semiconductor chip C2 stacked on the upper surfaces of the two first semiconductor chips C1a and C1b. The second semiconductor chip C2 may completely cover the upper surfaces of the two first semiconductor chips C1a and C1b as viewed from above the upper surface of the package base substrate 10.

Accordingly, all of the four edges of the second semiconductor chip C2 may protrude beyond the outside edges of the two first semiconductor chips C1a and C1b.

Referring to FIG. 34, a semiconductor package 8-2 includes the package base substrate 10, two first semiconductor chips C1a and C1b attached to the upper surface of the package base substrate 10, and a second semiconductor chip C2 stacked on the upper surfaces of the upper surfaces of the two first semiconductor chips C1a and C1b. The second semiconductor chip C2 may cover portions of the upper surfaces of the two first semiconductor chips C1a and C1b as viewed from above the upper surface of the package base substrate 10.

Accordingly, a portion of the second semiconductor chip C2 may be stacked above an area between the two first semiconductor chips C1a and C1b, and two of the edges of the second semiconductor chip C2 may respectively protrude beyond an outside edge of each of the two first semiconductor chips C1a and C1b.

Referring to FIG. 35, a semiconductor package 8-3 includes the package base substrate 10, two first semiconductor chips C1a and C1b attached to the upper surface of the package base substrate 10, and a second semiconductor chip C2 stacked on the upper surfaces of the two first semiconductor chips C1a and C1b. The second semiconductor chip C2 may cover portions of the upper surfaces of the two first semiconductor chips C1a and C1b as viewed from above the upper surface of the package base substrate 10.

Accordingly, a portion of the second semiconductor chip C2 may be stacked above a region between the two first semiconductor chips C1a and C1b, and three of the edges of the second semiconductor chip C2 may protrude beyond two outside edges of each of the two first semiconductor chips C1a and C1b.

Figure 36:
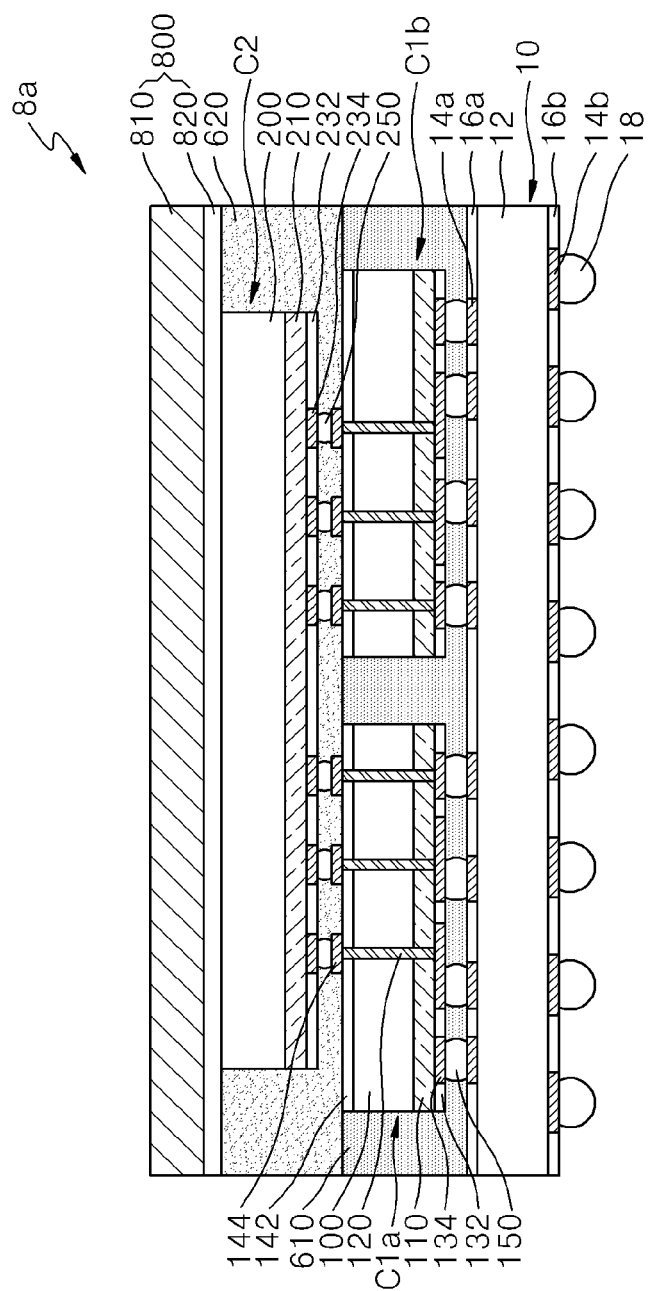

FIG. 36 is an exemplary cross-sectional view of a semiconductor package 8a, which is a modification of the semiconductor package 8 of FIG. 32.

Referring to FIG. 36, the semiconductor package 8a includes the package base substrate 10, two first semiconductor chips C1a and C1b attached to the upper surface of the package base substrate 10, and a second semiconductor chip C2 stacked on the upper surfaces of the two first semiconductor chips C1a and C1b.

The first semiconductor chip C1a may be formed on the same level as the first semiconductor chip C1b with respect to the upper surface of the package base substrate 10.

A width of the second semiconductor chip C2 in the first direction (for example, a horizontal direction in FIG. 36) parallel to the upper surface of the package base substrate 10 may be smaller than the combined width of the two first semiconductor chips C1a and C1b.

However, a portion of the second semiconductor chip C2 may exist over a region between the two first semiconductor chips C1a and C1b from among the region outside the two first semiconductor chips C1a and C1b.

Thus, a first molding member 610 that covers the two first semiconductor chips C1a and C1b, and a second molding member 620 that covers the second semiconductor chip C2 may be separately formed.

The first molding member 610 may cover the two first semiconductor chips C1a and C1b. The second molding member 620 may cover the second semiconductor chip C2.

Figure 37:
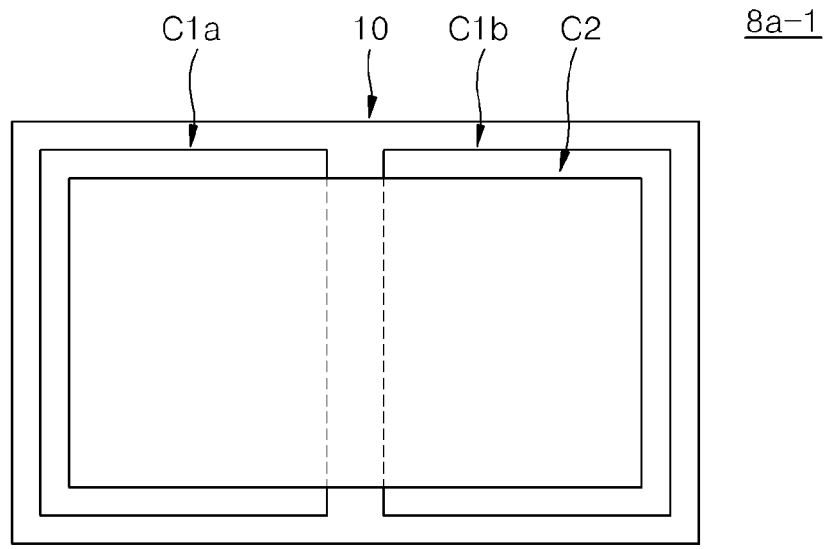
Figure 38:
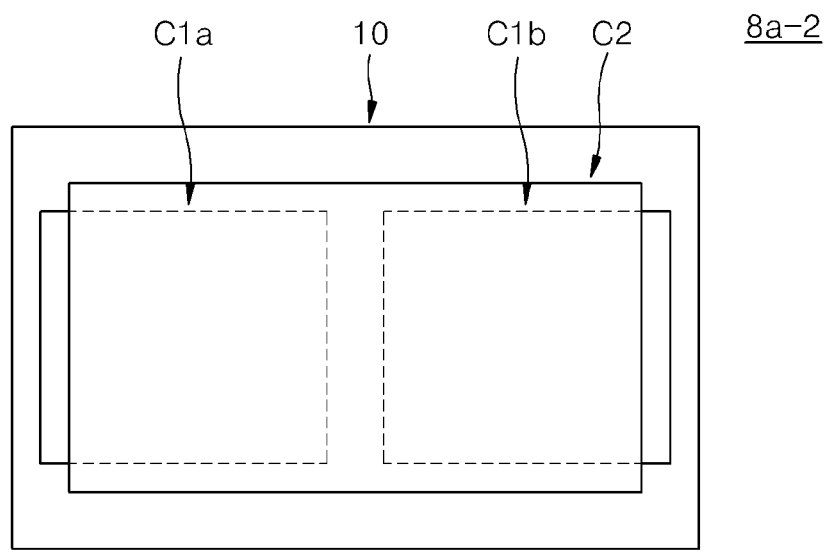
Figure 39:
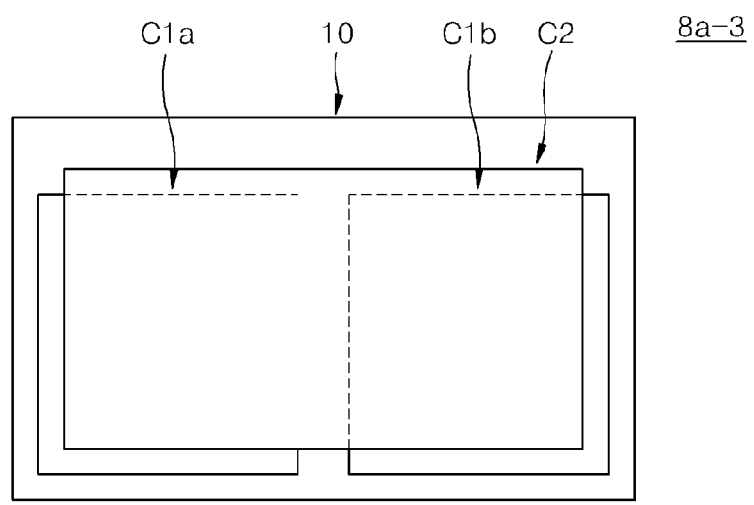

FIGS. 37 through 39 are exemplary planar arrangement views for illustrating aspects of the semiconductor package 8a of FIG. 36. In detail, FIGS. 37 through 39 are plan views for illustrating planar arrangements between the two first semiconductor chips C1a and C1b and the second semiconductor chip C2 included in the semiconductor package 8a of FIG. 36. Accordingly, components other than the package base substrate 10, the two first semiconductor chips C1a and C1b, and the second semiconductor chip C2 are not illustrated.

Referring to FIG. 37, a semiconductor package 8a-1 includes the package base substrate 10, two first semiconductor chips C1a and C1b attached to the upper surface of the package base substrate 10, and a second semiconductor chip C2 stacked on the upper surfaces of the two first semiconductor chips C1a and C1b. The second semiconductor chip C2 may cover portions of the upper surfaces of the two first semiconductor chips C1a and C1b as viewed from above the upper surface of the package base substrate 10.

Thus, outside edges of the second semiconductor chip C2 do not protrude beyond outside edges of the two first semiconductor chips C1a and C1b, but a portion of the center of the second semiconductor chip C2 may protrude over a region between the two first semiconductor chips C1a and C1b from among the region outside the two first semiconductor chips C1a and C1b.

Referring to FIG. 38, a semiconductor package 8a-2 includes the package base substrate 10, two first semiconductor chips C1a and C1b attached to the upper surface of the package base substrate 10, and a second semiconductor chip C2 stacked on the upper surfaces of the two first semiconductor chips C1a and C1b. The second semiconductor chip C2 may cover portions of the upper surfaces of the two first semiconductor chips C1a and C1b except for an outside edge of the first semiconductor chip C1a and an outside edge of the second semiconductor chip C2 which are opposite to each other, as viewed from above the upper surface of the package base substrate 10.

Accordingly, two of the four edges of the second semiconductor chip C2 may protrude beyond outside edges of the two first semiconductor chips C1a and C1b.

Referring to FIG. 39, a semiconductor package 8a-3 includes the package base substrate 10, two first semiconductor chips C1a and C1b attached to the upper surface of the package base substrate 10, and a second semiconductor chip C2 stacked on the upper surfaces of the two first semiconductor chips C1a and C1b. The second semiconductor chip C2 may cover portions of the upper surfaces of the two first semiconductor chips C1a and C1b including an inner edge of the first semiconductor chip C1a and an inner edge of the first semiconductor chip C2 which face each other, as viewed from above the upper surface of the package base substrate 10.

Accordingly, one of the four edges of the second semiconductor chip C2 may protrude beyond outside edges of the two first semiconductor chips C1a and C1b.

Although the semiconductor packages 1, 1-1, 1-2, 1-3, 1a, 2, 2a, 2b, 3, 3a, 4, 4a, 5, 5a, 6, 7, 7-1, 7-2, 7-3, 8, 8-1, 8-2, 8-3, 8a, 8a-1, 8a-2, and 8a-3 include two or three semiconductor chips in FIGS. 9-13, 16, 17, and 21-39, a semiconductor package including 4 or more semiconductor chips may be realized. For example, stacked semiconductor packages in which 4 or more semiconductor chips are sequentially stacked on the package base substrate 10, or stacked semiconductor packages in which 3 or more semiconductor chips are disposed on the same level as one another with respect to the upper surface of the package base substrate 10 may be realized.

Although it is illustrated that a separate molding member is formed only when an upper semiconductor chip protrudes beyond a lower semiconductor chip as viewed from above the upper surface of the package base substrate 10, a separate molding member may be formed even when the lower semiconductor chip and the upper semiconductor chip are partially overlapped with each other or when the upper semiconductor chip is completely covered by the lower semiconductor chip. Nonetheless, certain benefits are achieved, such as discussed above, by including separate molding members when a higher-level semiconductor chip or group of chips overhangs a lower-level semiconductor chip or group of chips.

It is illustrated in FIGS. 23 through 26 that, in the semiconductor packages 4, 4a, 5, and 5a, the space between the first semiconductor chip C1 and the second semiconductor chip C2 or the space between the second semiconductor chip C2 and the third semiconductor chip C3 is filled with the first molding member 610 or the second molding member 620 via an MUF process. However, as in semiconductor package 2 or 3 of FIG. 16 or 21, the underfill layer 710 or 720 may be formed to fill the space.

Similarly, in the semiconductor package 6 of FIG. 27, the space between the first semiconductor chip C1 and the second semiconductor chip C2 and the space between the second semiconductor chip C2 and the third semiconductor chip C3 may be respectively filled with the second molding member 620 and the third molding member 630 via an MUF process. In the semiconductor package 7 of FIG. 28, the space between the first semiconductor chip C1 and the second semiconductor chips C2a and C2b is filled with the second molding member 620 via an MUF process. In the semiconductor packages 8 and 8a, the space between the first semiconductor chips C1a and C1b and the second semiconductor chip C2 is filled with the second molding member 620 via an MUF process. However, as in the semiconductor package 2 or 3 of FIG. 16 or 21, the underfill layer 710 or 720 may be formed to fill the space.

Figure 40:
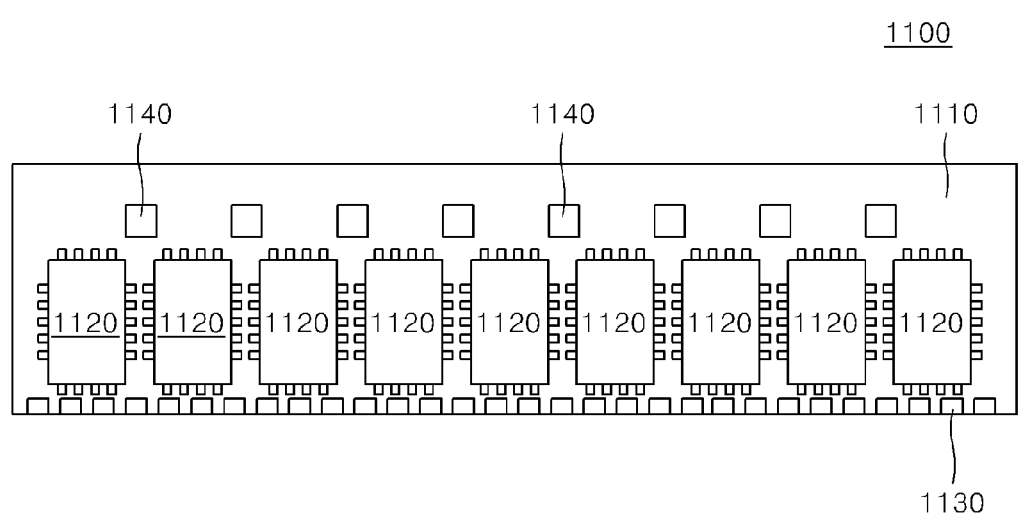
FIG. 40 is a plan view of an exemplary memory module including a semiconductor package, according to one embodiment.

FIG. 40 is a plan view of an exemplary memory module 1100 including a semiconductor package, according to an embodiment of the inventive concept.

Referring to FIG. 40, the memory module 1100 includes a module substrate 1110 and a plurality of semiconductor packages 1120 attached to the module substrate 1110.

The semiconductor packages 1120 may include one or more semiconductor packages according to the various embodiments described above. For example, the semiconductor packages 1120 may include the semiconductor packages 1, 1-1, 1-2, 1-3, 1a, 2, 2a, 2b, 3, 3a, 4, 4a, 5, 5a, 6, 7, 7-1, 7-2, 7-3, 8, 8-1, 8-2, 8-3, 8a, 8a-1, 8a-2, and 8a-3 of FIGS. 9-13, 16, 17, and 21-39. Some or all of the semiconductor packages 1120 may be different types of packages according to the different embodiments, or all of the semiconductor packages 1120 may be the same type of package according to one of the embodiments described above.

Connection units 1130 that may fit into sockets of a mother board are arranged on one side of the module substrate 1110. Ceramic decoupling capacitors 1140 are arranged on the module substrate 1110. The memory module 1100 is not limited to the configuration illustrated in FIG. 40 and may be manufactured in various forms.

Figure 41:
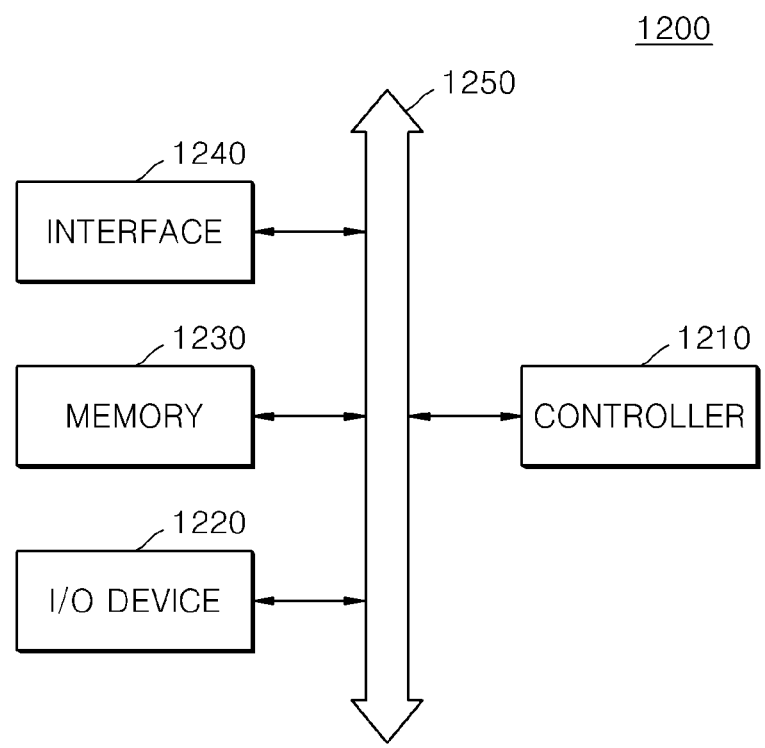
FIG. 41 is a block diagram of an exemplary system including a semiconductor package, according to one embodiment.

FIG. 41 is a block diagram of an exemplary system 1200 including a semiconductor package, according to an embodiment of the inventive concept.

Referring to FIG. 41, the system 1200 may include a controller 1210, an input/output (I/O) device 1220, a memory device 1230, and an interface 1240. The system 1200 may be, for example, a mobile system, or a system that transmits or receives information. In some embodiments, the mobile system is a personal digital assistant (PDA), a portable computer, a web tablet, a cordless phone, a mobile phone, a digital music player, or a memory card. The controller 1210 controls programs that are executed in the system 1200, and may be a microprocessor, a digital signal processor, a microcontroller, or a device similar to these devices. The I/O device 1220 may be used to input or output the data of the system 1200. The system 1200 may be connected to an external device, for example, a personal computer or a network, by using the I/O device 1220, and may exchange data with the external device. The I/O device 1220 may be a keypad, a keyboard, or a display.

The memory device 1230 may store a code and/or data for operating the controller 1210, or store data processed by the controller 1210. In one embodiment, the memory device 1230 includes a semiconductor package according to an embodiment of the inventive concept. For example, the memory device 1230 may include the semiconductor package 1, 1-1, 1-2, 1-3, 1a, 2, 2a, 2b, 3, 3a, 4, 4a, 5, 5a, 6, 7, 7-1, 7-2, 7-3, 8, 8-1, 8-2, 8-3, 8a, 8a-1, 8a-2, or 8a-3 of FIG. 9-13, 16, 17, or 21-39.

The interface 1240 may be a data transmission path between the system 1200 and another external device. The controller 1210, the I/O device 1220, the memory device 1230, and the interface 1240 may communicate with each other via a bus 1250. The system 1200 may be applied, for example, to mobile phones, MP3 players, navigations, portable multimedia players (PMPs), solid state disks (SSDs), or household appliances.

Figure 42:
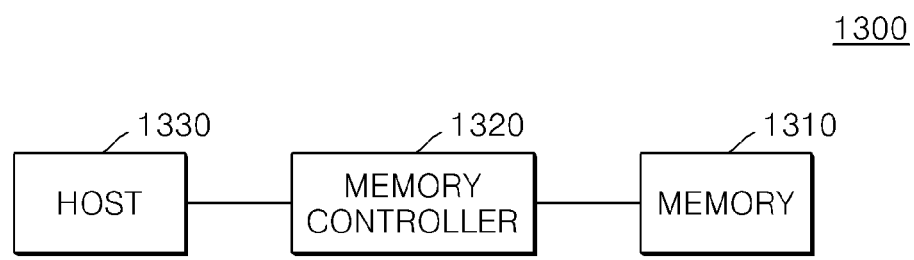
FIG. 42 is a block diagram of an exemplary memory card including a semiconductor package, according to one embodiment.

FIG. 42 is a block diagram of an exemplary memory card 1300 including a semiconductor package, according to an embodiment of the inventive concept.

Referring to FIG. 42, the memory card 1300 includes a memory device 1310 and a memory controller 1320.

The memory device 1310 may store data. In some embodiments, the memory device 1310 is a non-volatile memory that can retain stored data even when power supplied thereto is interrupted. The memory device 1310 includes a semiconductor package according to an embodiment of the inventive concept. For example, the memory device 1310 may include the semiconductor package 1, 1-1, 1-2, 1-3, 1a, 2, 2a, 2b, 3, 3a, 4, 4a, 5, 5a, 6, 7, 7-1, 7-2, 7-3, 8, 8-1, 8-2, 8-3, 8a, 8a-1, 8a-2, or 8a-3 of FIG. 9-13, 16, 17, or 21-39.

The memory controller 1320 may read data from the memory device 1310 or write data to the memory device 1310, in response to a read/write request from a host 1330.

In a semiconductor package according to one or more of the disclosed embodiments and a manufacturing method thereof, when an upper semiconductor chip from among at least two semiconductor chips stacked within the semiconductor package overhangs a lower semiconductor chip, the upper semiconductor chip may be prevented from being physically damaged during the formation of the semiconductor package. The damage prevention may result from the use of two separate molding members applied at different times, wherein a molding at a same level as the lower semiconductor chip helps prevent damage to the upper semiconductor chip when the upper semiconductor chip is attached.

Thus, the semiconductor chips may be stacked regardless of the sizes of semiconductor chips, thereby forming a semiconductor package. As such, regardless of the sizes of the semiconductor chips, a stacking order of the semiconductor chips may be determined in consideration of the performance and characteristics of each semiconductor chip. Therefore, a high-performance semiconductor package may be obtained.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
    a package base substrate;
    at least one first semiconductor chip disposed on the package base substrate;
    a first molding member disposed at a same level as the at least one first semiconductor chip and that does not cover an upper surface of the at least one first semiconductor chip;
    at least one second semiconductor chip stacked on the at least one first semiconductor chip so as to extend over the at least one first semiconductor chip and the first molding member, wherein the at least one first semiconductor chip and at least part of the first molding member are disposed between the package base substrate and the at least one second semiconductor chip; and
    a second molding member disposed at a same level as the at least one second semiconductor chip, wherein
    the second molding member contacts the first molding member at an interface,
    the first molding member is formed of a material that has a first Young's modulus, and the second molding member is formed of a material that has a second Young's modulus greater than the first Young's modulus, and
    wherein an outer lateral surface of the first molding member is coplanar with an outer lateral surface of the second molding member.

2. The semiconductor package of claim 1, wherein the first molding member covers a lateral surface of the at least one first semiconductor chip.

3. The semiconductor package of claim 1, wherein an upper surface of the first molding member is formed at a same level as the upper surface of the at least one first semiconductor chip with respect to an upper surface of the package base substrate.

4. The semiconductor package of claim 1, wherein the second molding member does not cover an upper surface of the at least one second semiconductor chip.

5. The semiconductor package of claim 4, wherein the second molding member covers a lateral surface of the at least one second semiconductor chip.

6. The semiconductor package of claim 1, wherein the second molding member covers an upper surface and a lateral surface of the at least one second semiconductor chip.

7. The semiconductor package of claim 1, wherein:
    the material that forms the first molding member is a first material that includes first filler particles that cause the first molding member to have the first Young's modulus; and
    the material that forms the second molding member is the first material that includes second filler particles that cause the second molding member to have the second Young's modulus.

8. The semiconductor package of claim 7, wherein the first material is a resin.

9. The semiconductor package of claim 1, wherein:
    the material that forms the second molding member covers lateral surfaces of the at least one second semiconductor chip and fills a space between the at least one first semiconductor chip and the at least one second semiconductor chip.

10. The semiconductor package of claim 1, wherein:
    the material that forms the second molding member covers lateral surfaces of the at least one second semiconductor chip and a different material fills a space between the at least one first semiconductor chip and the at least one second semiconductor chip, such that both the at least one second semiconductor chip and the different material cover a top-most surface of the first molding member.

11. The semiconductor package of claim 1, wherein
    the at least one first semiconductor chip comprises a penetrating electrode, and
    the at least one second semiconductor chip is electrically connected to the package base substrate via the penetrating electrode.

12. The semiconductor package of claim 1, wherein an upper surface of the at least one second semiconductor chip is larger than the upper surface of the at least one first semiconductor chip, and/or a width of the at least one second semiconductor chip in a first direction parallel to an upper surface of the package base substrate is greater than a width of the at least one first semiconductor chip in the first direction.

13. A semiconductor package comprising:
    a package substrate at a bottom of the semiconductor package;
    a first semiconductor chip stacked on the package substrate, and disposed above the package substrate;
    a second semiconductor chip stacked on the package substrate, and disposed above the first semiconductor chip, wherein the second semiconductor chip overhangs the first semiconductor chip;
    a set of first through electrodes that extend vertically through the first semiconductor chip and electrically connect circuitry of the package substrate to circuitry of the second semiconductor chip;
    a first molding member at a same level as the first semiconductor chip and covering lateral surfaces of the first semiconductor chip; and
    a second molding member at a same level as the second semiconductor chip and covering lateral surfaces of the second semiconductor chip,
    wherein the second semiconductor chip vertically overlaps at least part of the first molding member; and
    wherein a top-most surface of the first molding member contacts a bottom-most surface of the second molding member at an interface between the first molding member and the second molding member.

14. The semiconductor package of claim 13, wherein the first molding member has a first elasticity, and the second molding member has a second elasticity less than the first elasticity.

15. The semiconductor package of claim 13, wherein the first molding member and second molding member are formed either of the same materials having different amounts or sizes of filler, or of different materials.

16. The semiconductor package of claim 13, wherein the second molding member fills a space between the first semiconductor chip and the second semiconductor chip.

17. A semiconductor package comprising:

a package substrate;

a first semiconductor chip attached onto the package substrate and comprising a penetrating electrode;

a first molding member that covers an upper surface of the package substrate and has an upper surface that is formed on a same plane as an upper surface of the first semiconductor chip;

a second semiconductor chip that is stacked on the first semiconductor chip, is electrically connected to the package substrate via the penetrating electrode, and overlaps a portion of the first molding member as viewed from above the upper surface of the package substrate; and a second molding member that covers at least a portion of the second semiconductor chip and has a lateral surface that extends from a lateral surface of the first molding member in a direction perpendicular to the upper surface of the package substrate.

18. The semiconductor package of claim 17, wherein outer lateral surfaces of the second molding member are coplanar with outer lateral surfaces of the first molding member.

* * * * *